United States Patent
Zhou

(10) Patent No.: US 9,425,822 B2
(45) Date of Patent: Aug. 23, 2016

(54) SIMPLIFIED RANGE AND CONTEXT UPDATE FOR MULTIMEDIA CONTEXT-ADAPTIVE BINARY ARITHMETIC CODING DESIGN

(71) Applicant: Broadcom Corporation, Irvine, CA (US)

(72) Inventor: Minhua Zhou, San Diego, CA (US)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/806,199

(22) Filed: Jul. 22, 2015

(65) Prior Publication Data

US 2016/0043735 A1 Feb. 11, 2016

Related U.S. Application Data

(60) Provisional application No. 62/033,484, filed on Aug. 5, 2014.

(51) Int. Cl.
*H03M 7/00* (2006.01)
*H03M 7/40* (2006.01)
*H04N 19/13* (2014.01)

(52) U.S. Cl.
CPC .............. *H03M 7/4018* (2013.01); *H04N 19/13* (2014.11); *H03M 7/4006* (2013.01)

(58) Field of Classification Search
CPC ....... H04N 19/91; H04N 19/42; H04N 19/44; H04N 19/436; H04N 19/96; H04N 19/13; H04N 19/176; H04N 19/70; H04N 19/36; H04N 19/61; H04N 19/33; H04N 19/196; H03M 7/4006; H03M 7/4018; G06F 13/4243
USPC ............ 375/216; 714/114, 141, 162; 341/107
See application file for complete search history.

(56) References Cited

U.S. PATENT DOCUMENTS

| | | | | |
|---|---|---|---|---|
| 7,742,544 | B2* | 6/2010 | Schumann | G06F 13/4243 375/316 |
| 2004/0240559 | A1* | 12/2004 | Prakasam | H04N 19/91 375/240.25 |
| 2004/0268329 | A1* | 12/2004 | Prakasam | H04N 19/91 717/141 |
| 2006/0158355 | A1* | 7/2006 | Jeon | H04N 19/176 341/50 |
| 2006/0232452 | A1* | 10/2006 | Cha | H03M 7/4006 341/50 |
| 2006/0232454 | A1* | 10/2006 | Cha | H04N 19/13 341/51 |
| 2006/0233240 | A1* | 10/2006 | Cha | H04N 19/13 375/240.03 |
| 2014/0177708 | A1* | 6/2014 | Alshin | H04N 19/91 375/240.12 |

* cited by examiner

*Primary Examiner* — Lam T Mai
(74) *Attorney, Agent, or Firm* — Foley & Lardner LLP; Christopher J. McKenna; Daniel E. Rose

(57) ABSTRACT

In some aspects, the disclosure is directed to methods and systems for a context-adaptive binary arithmetic encoder and decoder utilizing a fixed point design for range and context updates. Symbol probabilities and probability adaptation factors can be scaled to a predetermined range, such as an 8-bit range, reducing the need for complex and operationally costly table look-ups.

20 Claims, 17 Drawing Sheets

SIMPLIFIED RANGE AND CONTEXT UPDATE FOR MULTIMEDIA CONTEXT-ADAPTIVE BINARY ARITHMETIC CODING DESIGN

RELATED APPLICATIONS

The present application claims priority to and the benefit of U.S. provisional patent application No. 62/033,484, entitled "Simplified range and context update for multimedia context-adaptive binary arithmetic coding design," filed Aug. 5, 2014, the entirety of which is herein incorporated by reference.

FIELD OF THE DISCLOSURE

This disclosure generally relates to systems and methods for multimedia compression. In particular, this disclosure relates to systems and methods for improved context-adaptive binary arithmetic coding for high efficiency video coding.

BACKGROUND OF THE DISCLOSURE

Context-adaptive binary arithmetic coding (CABAC) is a lossless entropy coding method utilized in a variety of video standards, including the high efficiency video coding (HEVC) standard promulgated by the Moving Picture Experts Group (MPEG) and the International Telecommunication Union (ITU); the H.264 or Advanced Video Coding (AVC) standard; the VP9 standard; the Audio Video Standard (AVS) standards; or other video compression and encoding/decoding methods. CABAC uses probability models based on local context, such as regions within the same or adjacent video frames, to achieve compression ratios beyond those of non-context adaptive algorithms.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1:
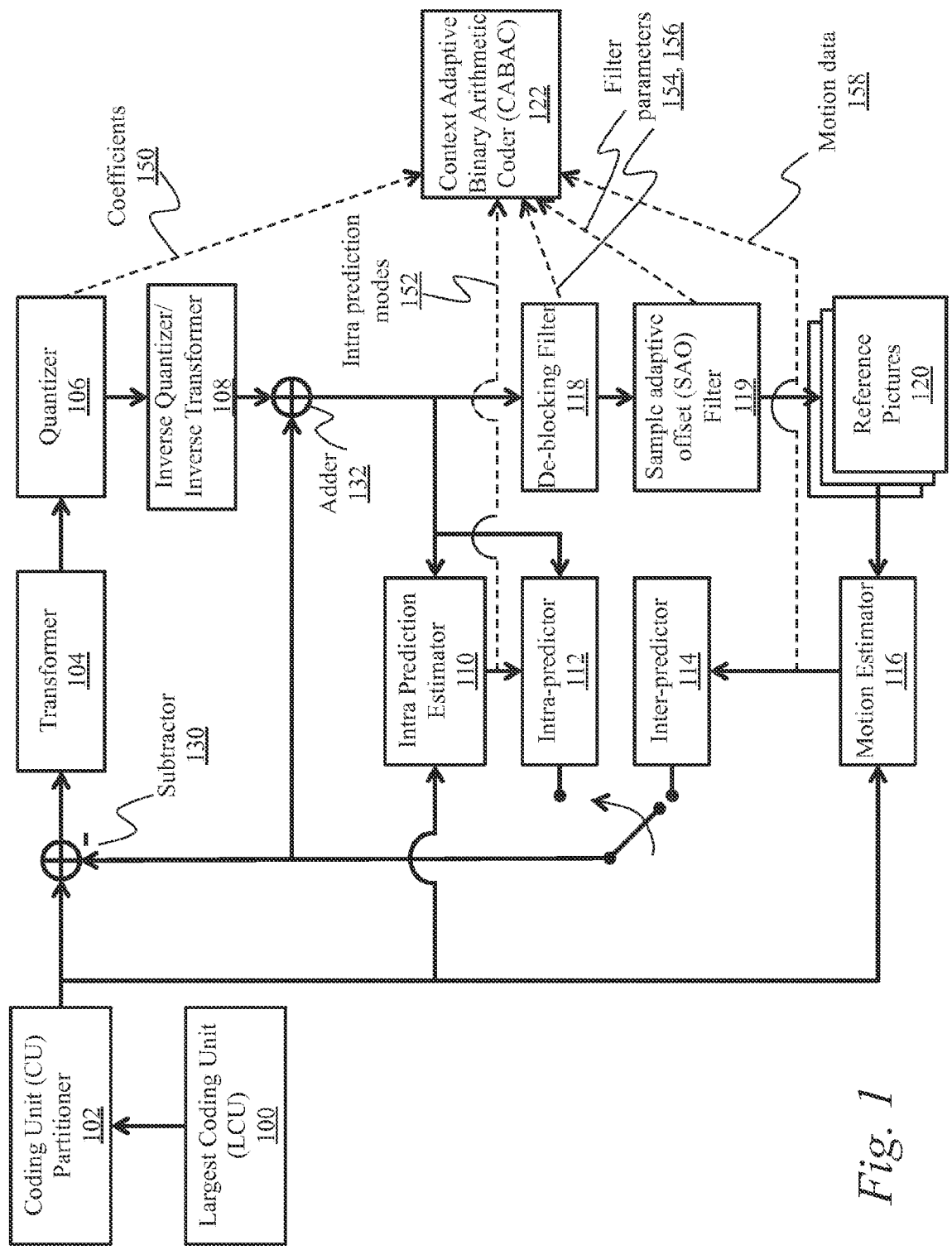
FIG. 1 is a block diagram of an embodiment of an HEVC encoder.

The details of various embodiments of the methods and systems are set forth in the accompanying drawings and the description below.

DETAILED DESCRIPTION

For purposes of reading the description of the various embodiments below, the following descriptions of the sections of the specification and their respective contents may be helpful:

Section A describes embodiments of systems and methods for improved context-adaptive binary arithmetic coding for high efficiency video coding; and Section B describes systems which can be useful for practicing embodiments described herein.

A. Improved Context-Adaptive Binary Arithmetic Coding for High Efficiency Video Coding CABAC coding can be used to provide lossless entropy compression for various data sources, and is frequently used in connection with lossy compression applications including video compression and encoding. For example, the HEVC encoding standard utilizes a lossy compression to provide a data stream to a CABAC encoder, which can then be further compressed for transmission via a network, such as a broadband network, cable network, satellite network, cellular network, or any other type and form of network. However, some implementations of CABAC methods utilize complex probability range and context update systems, resulting in reduced throughput. In particular, the systems and methods discussed herein are directed to implementations of a CABAC encoder and decoder utilizing a fixed point design for range and context updates. Symbol probabilities and probability adaptation factors can be scaled to a predetermined range, such as an 8-bit range, reducing the need for complex and operationally costly table look-ups.

In one aspect, the present disclosure describes a method for simplified range and context updates for CABAC coding. The method includes receiving, by a range and context updater of a device from a CABAC encoder or decoder of the device, an encode context comprising a probability of a first least probable symbol. The method also includes scaling, by the range and context updater, the probability of the first least probable symbol within a predetermined range, such as 0 to 1, or an n-bit range with n greater than 1. The method further includes determining, by the range and context updater, a probability of a subsequent second least probable symbol based on the scaled probability of the first least probable symbol multiplied by a probability adaptation factor having a value within the predetermined n-bit range. The method also includes providing, by the range and context updater to the CABAC encoder or decoder, the determined probability of the subsequent second least probable symbol. In some implementations, determining the probability of the subsequent second least probable symbol is further based on the scaled probability of the first least probable symbol multiplied by the probability adaptation factor, plus $2^{n-1}$, divided by $2^n$. In other implementations, determining the probability of the subsequent second least probable symbol is further based on the scaled probability of the first least probable symbol multiplied by the probability adaptation factor, plus $2^n$ multiplied by the difference of $2^n$ and the probability adaptation factor, plus $2^{n-1}$, divided by $2^n$. In a further implementation, the encode and decode range parameter further includes a first range, and the method includes determining a second range based on the first range multiplied by the scaled probability of the first least probable symbol, plus $2^{n-1}$, divided by $2^n$; and providing the second range to the CABAC encoder or decoder. In other implementations, the method includes receiving, by the range and context updater, an identification of a most probable symbol; determining, by the range and context updater, that the probability of the first least probable symbol is greater than or equal to half of the predetermined range; and inverting the identification of the most probable symbol. In still other implementations, the method includes receiving an identification of a most probable symbol and a current symbol value; determining whether the most probable symbol is equal to the current symbol value; and responsive to the determination, adjusting the predetermined range for a subsequent encode or decode range parameter using the scaled probability of the first least probable symbol. In a further implementation, the method includes adjusting the predetermined range for the subsequent encode or decode range parameter by adjusting the range to a value inversely proportional to the probability of the least probable symbol, responsive to a determination that the current symbol value is equal to the identified most probable symbol. In another further implementation, the method includes adjusting the predetermined range for the subsequent encode or decode range parameter by reducing the range to a value proportional to the probability of the least probable symbol, responsive to a determination that the current symbol value is not equal to the identified most probable symbol.

In another aspect, the present disclosure is directed to a device for performing context and range updates for CABAC coding. The device includes a context adaptive binary arithmetic coding (CABAC) context receiver in communication with a CABAC encoder or decoder, configured to receive an encode or decode context comprising a probability of a first least probable symbol. The device also includes a CABAC range updater configured to scale the probability of the first least probable symbol within a predetermined range. The device further includes a CABAC context updater configured to determine a probability of a subsequent second least probable symbol using the scaled probability of the first least probable symbol multiplied by a probability adaptation factor having a value within the predetermined range, and provide the determined probability of the subsequent second least probable symbol to a CABAC context selector of the CABAC encoder or decoder. In some implementations, the predetermined range comprises an n-bit range, with n greater than 1. In a further implementation, the CABAC context updater is further configured to determine the probability of the subsequent second least probable symbol using the scaled probability of the first least probable symbol multiplied by the probability adaptation factor, plus $2^{n-1}$, divided by $2^n$. In another further implementation, the CABAC context updater is further configured to determine the probability of the subsequent second least probable symbol using the scaled probability of the first least probable symbol multiplied by the probability adaptation factor, plus $2^n$ multiplied by the difference of $2^n$ and the probability adaptation factor, plus $2^{n-1}$, divided by $2^n$. In still another further implementation, the encode or decode range parameter further comprises a first range; and the CABAC range updater is further configured to determine a second range using the first range multiplied by the scaled probability of the first least probable symbol, plus $2^{n-1}$, divided by $2^n$. In a still further implementation, the CABAC range updater is further configured to provide the second range to the CABAC encoder or decoder. In another implementation, the CABAC context receiver is further configured to receive an identification of a most probable symbol; and the CABAC context updater is further configured to determine that the probability of the first least probable symbol is greater than or equal to half of the predetermined range, and invert the identification of the most probable symbol. In still another implementation, the CABAC context receiver is further configured to receive an identification of a most probable symbol and a current symbol value; and the CABAC context updater is further configured to determine whether the most probable symbol is equal to the current symbol value, and responsive to the determination, adjust the predetermined range for a subsequent encode or decode range parameter using the scaled probability of the first least probable symbol. In a further implementation, the CABAC context updater is further configured to adjust the predetermined range for the subsequent encode or decode range parameter by adjusting the range to a value inversely proportional to the probability of the least probable symbol, responsive to a determination that the current symbol value is equal to the identified most probable symbol. In another further implementation, the CABAC context updater is further configured to adjust the predetermined range for the subsequent encode or decode range parameter by reducing the range to a value proportional to the probability of the least probable symbol, responsive to a determination that the current symbol value is not equal to the identified most probable symbol.

FIG. 1 is a block diagram of an embodiment of an HEVC encoder. As shown, an input data stream, such as a plurality of video images, frames, or fields, can be divided into a plurality of coding tree units (CTUs), sometimes referred to as largest coding units (LCUs) 100. In typical implementations, an LCU can be between 16×16 pixels and 64×64 pixels in size, with larger sizes increasing coding efficiency. LCUs can frequently be divided into further coding units (CUs), by a coding unit partitioner 102 (e.g. 8×8 pixels to 32×32 pixels in size, or any other such values) for better compression efficiency by multiple HEVC encoding units (e.g. blocks 104-120).

Partitioned coding units can be sent to a motion estimator 116 for global and/or local motion vector estimation and/or compensation; an intra-prediction estimator 110 for identifying a directional mode for intra prediction 112 based on data from neighboring prediction blocks that have been decoded; as well as a transformer 104 via a subtractor 130. Transformer 104 can perform any type and form of transformation, including discrete cosine transformations (DCT) and/or discrete sine transformations (DST), on the prediction residual (e.g. partitioned coding units minus intra- or inter-block predictions from intra-predictor 112 or inter-predictor 114, or the difference between the original block and its prediction).

The transformed coefficients from transformer 104 can be sent to a quantizer 106 for lossy compression and provided as quantized coefficients 150 to a CABAC engine 122, discussed in more detail below. The coefficients can also be provided to an inverse quantizer/inverse transformer 108 (to undo the quantization and transformation performed by transformer 104 and quantizer 106) and an adder 132 where the prediction is added to the quantized/inverse-quantized prediction residual. This duplicates processing in the HEVC decoder such that both the encoder and decoder generate identical predictions for subsequent data. In some implementations, quantization and inverse quantization 106, 108 can further include scaling and inverse scaling, respectively. Deblocking filter 118 and sample adaptive offset (SAO) filter 119 can be used to reduce artifacts from the partitioning, quantization and/or scaling, resulting in decoded reference pictures 120 which can be stored in a buffer for prediction of subsequent frames via motion estimator 116 and inter-predictor 114. As noted above, quantized transform coefficients 150 can be provided to a CABAC engine for compression and transmission, along with other data from the HEVC encoder: specifically, identification of intra prediction modes 152, deblocking filter parameters 154, SAO filter parameters 156, and/or motion data 158 such as global and/or local motion data (motion vectors, reference frame indices).

Figure 2:
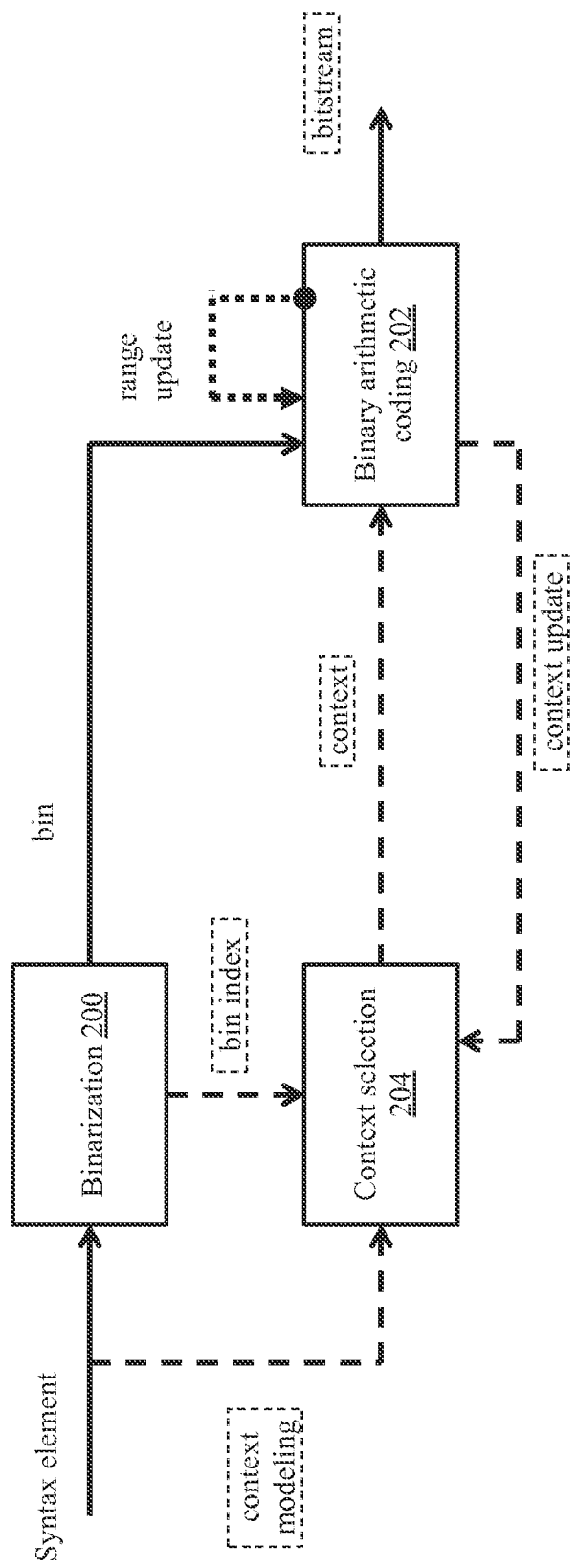
FIG. 2 is a block diagram of an embodiment of a CABAC encoder.

FIG. 2 is a block diagram of an embodiment of a CABAC encoder, such as CABAC engine 122 of FIG. 1. As shown, syntax elements (e.g. quantized transform coefficients, motion vectors, etc.) can be converted into a variable length sequence of binary elements (bins, equal to 1 or 0) by a binarization engine 200. Based on the bin index, context modeling identifications, and context update data including the previous bin value and neighboring data values, a context can be selected by a selection engine 204. The context can identify the most probable symbol value (valMps, e.g. 0 or 1), and the probability of the least probable symbol ($p_{LPS}$, e.g. a value from 0 to 1). The identification of the selected context can be provided to the coder 202, which can take the context (valMps, $p_{LPS}$) and the current binary value (binVal, e.g. 0 or 1) as an input, perform a range update and context update, and output a bitstream via range re-normalization. In some implementations, a CABAC encode or decode context can be expressed as (valMps, $p_{LPS}$), (valMps, $p_{MPS}$), (valLps, $p_{LPS}$), or (valLps, $p_{MPS}$). The systems and methods discussed herein may be applied to any such context, with calculations adjusted as necessary to reflect substituted terms (e.g. $p_{MPS}=1-p_{LPS}$ or $p_{LPS}=1-p_{MPS}$; valMps=1−valLps or valLps=1−valMps, etc.). Accordingly, while discussed primarily in terms of valMps and $p_{LPS}$ below, any combination of terms may be substituted as desired.

Figure 3:
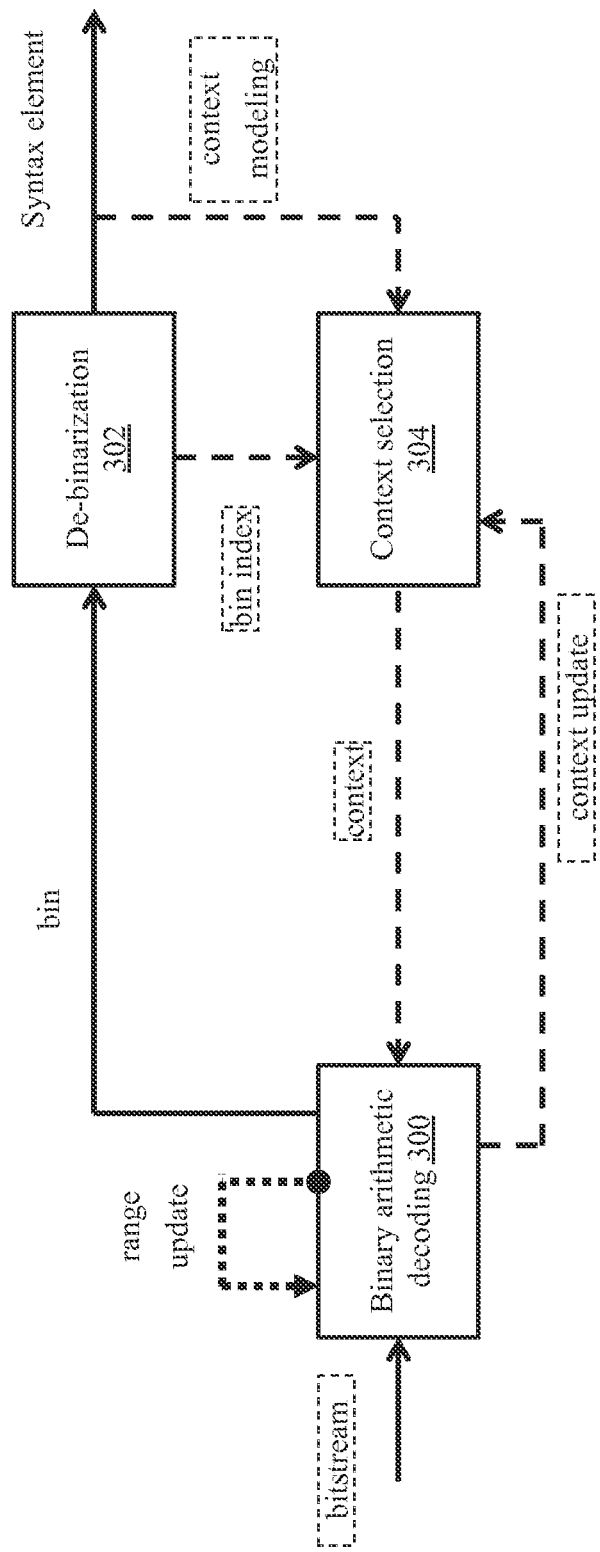
FIG. 3 is a block diagram of an embodiment of a CABAC decoder.

FIG. 3 is a block diagram of an embodiment of a CABAC decoder. As shown, a decoder 300 receives the incoming compressed bitstream and, within a selected context of the current bin (valMps, $p_{LPS}$), performs range-renormalization to determine the value of each bin. The decoder 300 can provide a context update to a selection engine 304, which, as with engine 204, uses context modeling identifications, and context update data including the previous bin value and neighboring data values to select a context for decoder 300. The decoded bins can be provided to a de-binarization engine 302, which can decode bins into the original syntax elements. HEVC decoding can use the syntax elements as discussed above in a similar model to the encoder to generate output image data.

Figure 4A:
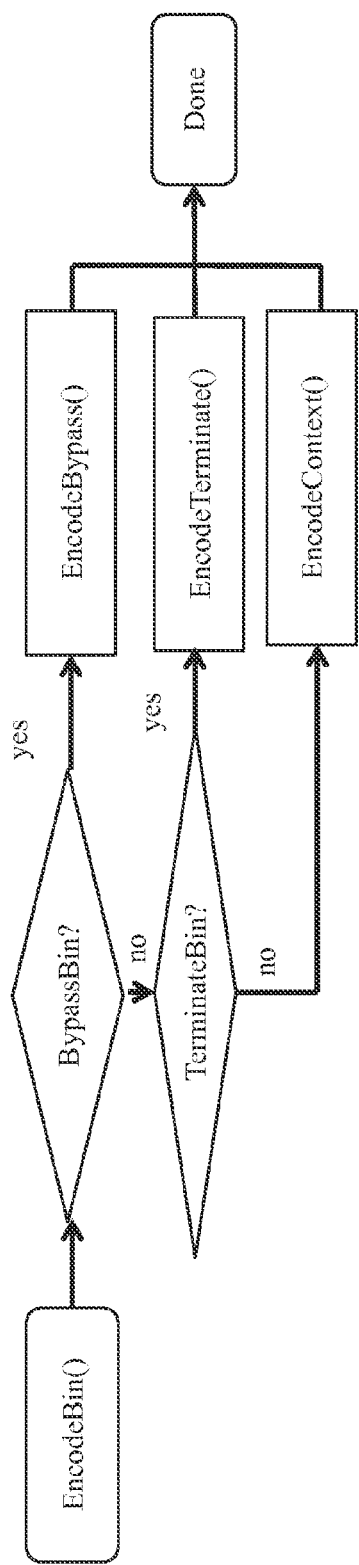
FIG. 4A and 4B are flow charts of embodiments of CABAC binarization classification, during encoding and decoding respectively.
Figure 4B:
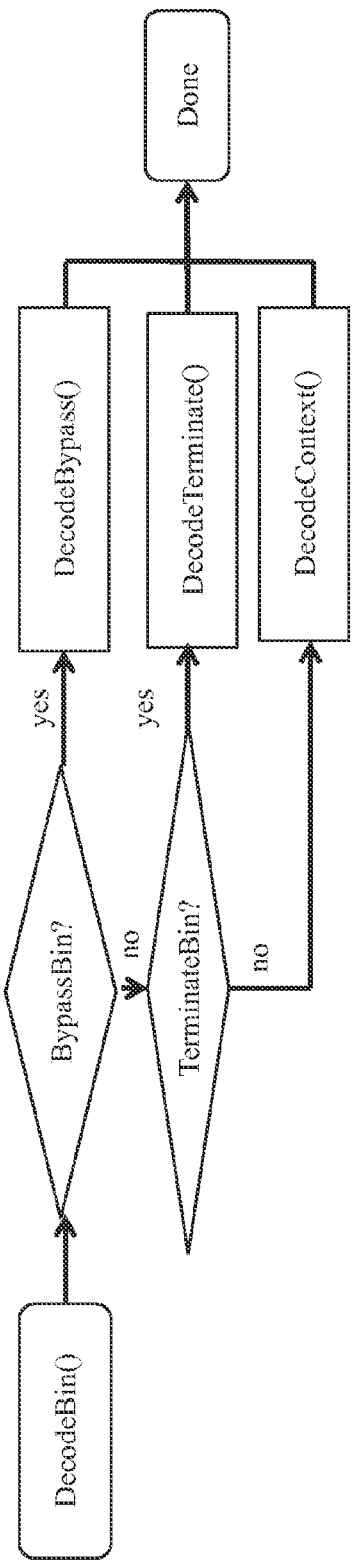

FIGS. 4A and 4B are flow charts of embodiments of CABAC binarization classification, during encoding and decoding respectively. Specifically, during binarization while encoding, three types of bins can be generated: a regular or in-context bin; a bypass bin; or a terminate bin. Respectively, these bins have unequal, equal or dominant probabilities of the binary value being 1 or 0. A terminate bin, for example, can be a predetermined value indicating the beginning or end of a syntax element. Bin type can be identified to the encoder or decoder via bypass flags and/or context index identifiers. Unlike regular bins and terminate bins, a bypass bin does not require any context identification, and can be independent of other bins. In the following specification bins may be sometimes referred to as symbols.

Figure 5:
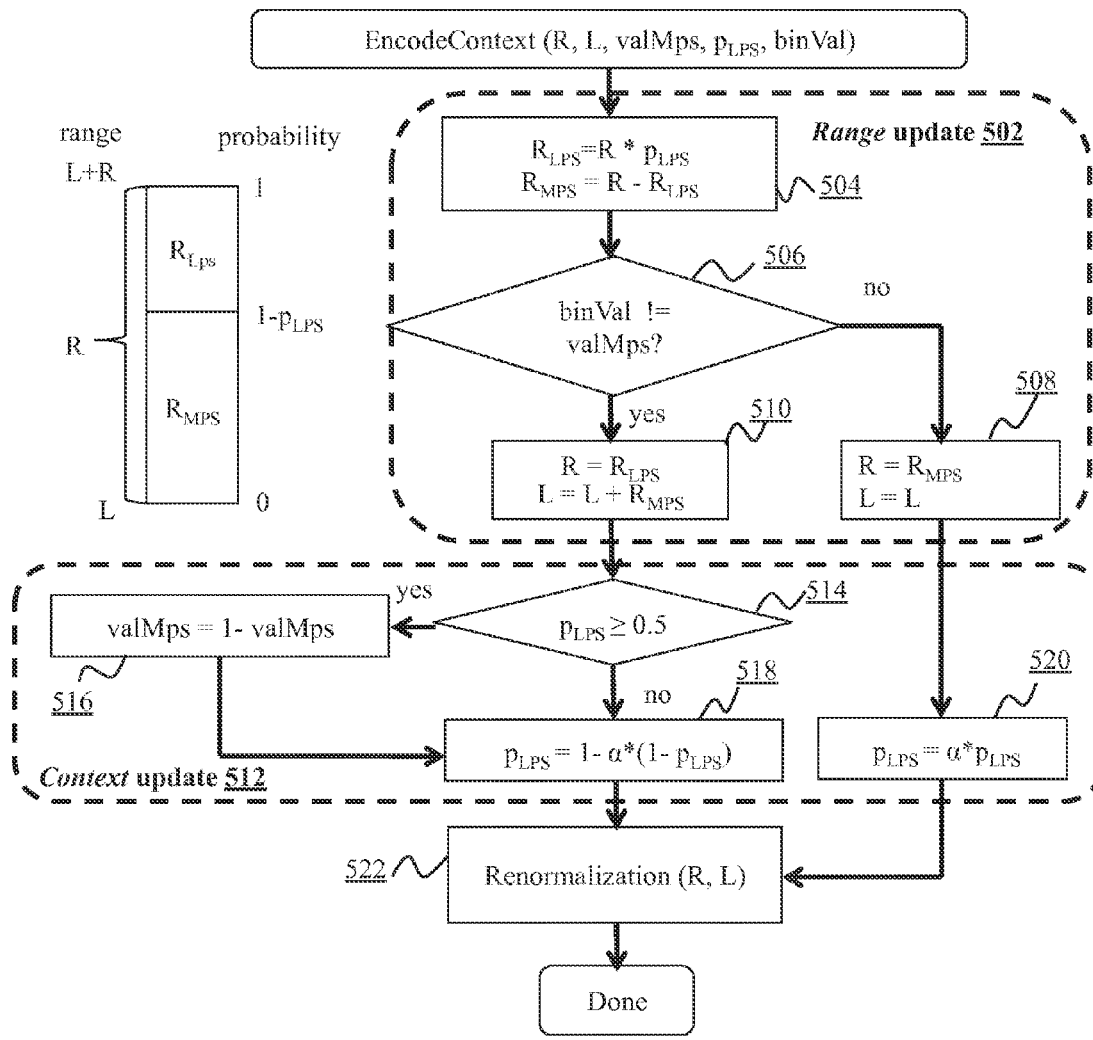
FIG. 5 is a flow chart of a first embodiment of CABAC range and context updating during encoding.

As discussed above, a CABAC coder can use a context (valMps, $p_{LPS}$) and value (binVal) of a current bin as an input. Other inputs can include a range update based on the incoming binVal, valMps, and $p_{LPS}$. FIG. 5 is a flow chart of a first embodiment of CABAC range and context updating during encoding. As shown, the range update can be defined by values L, R, with L representing the bottom of the range and L+R representing the top of the range. As discussed above, $p_{LPS}$ can define the value of the probability of the least probable symbol, such that (1 minus $p_{LPS}$) defines the probability of the most probable symbol (MPS). These probabilities can be mapped to the range to identify a range for the least probable symbol ($R_{LPS}$) and range for the most probable symbol ($R_{MPS}$), as shown at step 504 of range update 502, with $R_{LPS}$ equal to R times $p_{LPS}$; and $R_{MPS}$ equal to R minus RLPS. At step 506, the encoder can determine if the binVal is equal to the valMps. If the binVal is equal to the valMps, then at step 508, the range can be updated with the updated R equal to $R_{MPS}$ and the updated L equal to L (e.g., reducing the overall range to within the previous $R_{MPS}$). If binVal is not equal to valMps, then at step 510, the range can be updated with the updated R equal to $R_{LPS}$ and the updated L equal to L plus $R_{MPS}$ (e.g., reducing the overall range to within the previous $R_{LPS}$).

During the context update 512, if the binVal was equal to the valMps, then at step 520, $p_{LPS}$ can be adjusted by a probability adaptation factor α (with α being a value between 0 and 1). Conversely, if the binVal was not equal to the valMps, then at step 514, the encoder can determine whether $p_{LPS}$ was greater than or equal to 0.5. If $p_{LPS}$ was greater than or equal to 0.5, then at step 516, the context can be updated with the updated valMps equal to 1 minus the previous valMps. If $p_{LPS}$ was less than 0.5, then step 516 can be skipped. At step 518, $p_{LPS}$ can be updated to be equal to 1 minus the probability adaptation factor α times 1 minus the previous $p_{LPS}$. At step 522, the range can be renormalized to take advantage of any unused bits in the range (e.g. if the range is calculated as an 8 bit value, and after the range update 502, L+R can be expressed in 7 bits or fewer, the unused bits can be shifted to the least significant bits, or the range renormalized to take advantage of the full precision).

Figure 6:
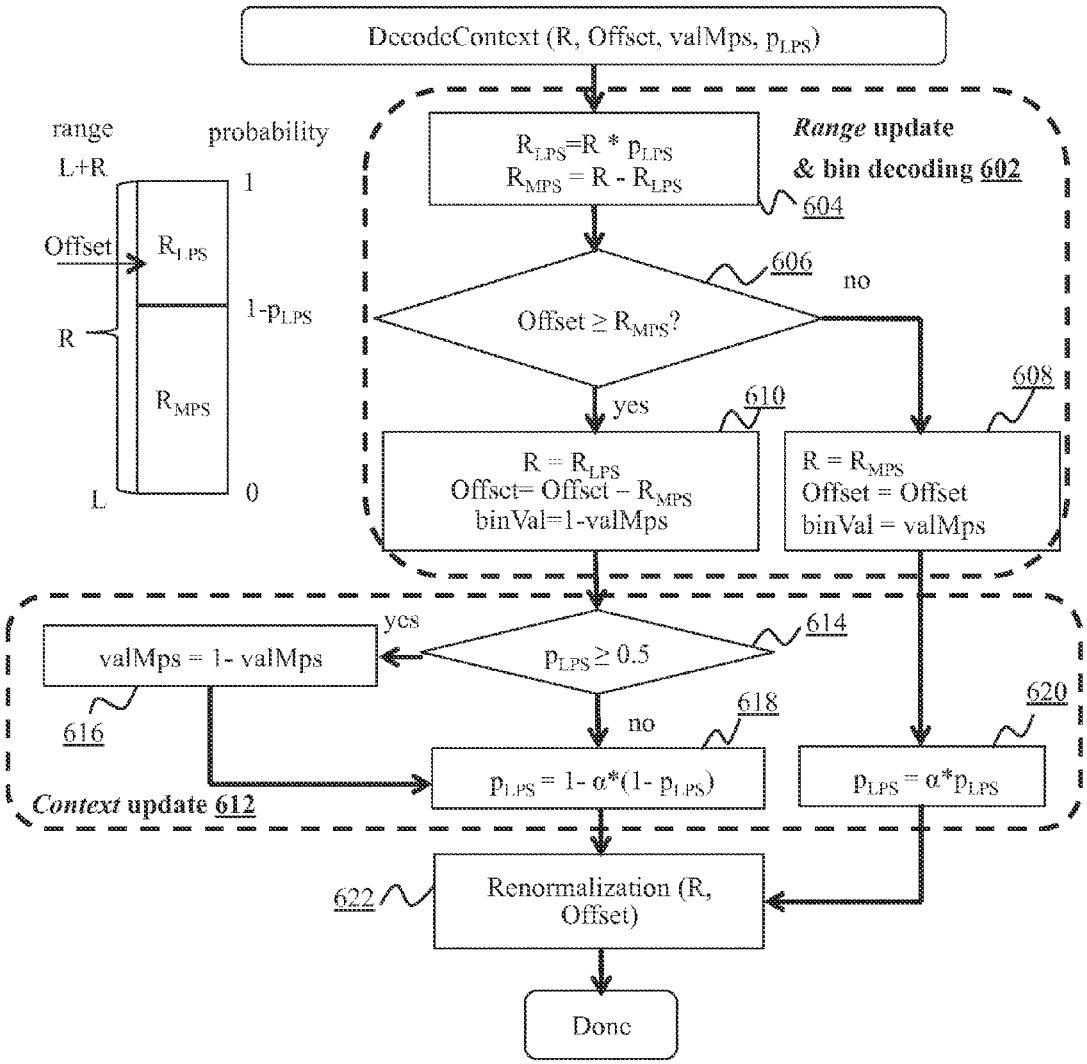
FIG. 6 is a flow chart of a first embodiment of CABAC range and context updating during decoding.

FIG. 6 is a flow chart of a first embodiment of CABAC range and context updating during decoding. The binVal can be decoded based on decode context of (valMps, $p_{LPS}$), range R, and an offset within the range. The process is similar to the range and context updating procedure during encoding as shown in the embodiment of FIG. 5, with differences around the use of an offset within the range rather than a least value of the range L. At step 604 of the bin decoding and range update procedure 602, the decoder can determine $R_{LPS}$ and $R_{MPS}$ from the input range and probability, with $R_{LPS}$ equal to R times $p_{LPS}$; and $R_{MPS}$ equal to R minus $R_{LPS}$. At step 606, the decoder can determine if the offset is greater than or equal to $R_{MPS}$ (i.e. within the range $R_{LPS}$). If the offset is not greater than or equal to $R_{MPS}$, then at step 608, the range R can be updated to equal $R_{MPS}$, the offset remains unchanged, and the binVal can be decoded as equal to the valMps. Accordingly, the most probable symbol is confirmed based on the offset and output, and the overall range is reduced to the range of said symbol. Conversely, if the offset is greater than or equal to $R_{MPS}$, then at step 610, the range R can be updated to equal $R_{LPS}$; the binVal can be output as the inverse of valMps (e.g. 1−valMps); and the offset can be remapped to the new range as equal to the offset minus $R_{MPS}$.

Context updating 612 is similar to context updating 512 discussed above in connection with the embodiment of FIG. 5. If the offset was not greater than or equal to the $R_{MPS}$, then at step 620, $p_{LPS}$ can be adjusted by a probability adaptation factor α (with α being a value between 0 and 1). Conversely, if the offset was greater than or equal to the $R_{MPS}$, then at step 614, the encoder can determine whether $p_{LPS}$ was greater than or equal to 0.5. If $p_{LPS}$ was greater than or equal to 0.5, then at step 616, the context can be updated with the updated valMps equal to 1 minus the previous valMps. If $p_{LPS}$ was less than 0.5, then step 616 can be skipped. At step 618, $p_{LPS}$ can be updated to be equal to 1 minus the probability adaptation factor α times 1 minus the previous $p_{LPS}$. At step 622, the range can be renormalized to take advantage of any unused bits in the range, with a new R and offset output as needed.

The embodiments illustrated in FIG. 5 and FIG. 6 can require one or more table look-ups to map ranges and probabilities. For example, in some implementations, a table size of 4 by 64 by 8 bits is needed for range updates, and a table size of 2 by 64 by 6 bits is needed for context updating. In the implementations of FIGS. 7-10, these table look-ups can be avoided by using a fixed point operation.

In fixed point range and context update implementations, the probability can be scaled to a range from 0 to $2^n$, with n equal to the bit depth selected. n can be 8 in many implementations such as the implementation shown in FIGS. 7-8 and 11-12, or can be 16, 32, or any other such value. For example, FIGS. 9-10 and 13-14 illustrate an implementation using n of 13, or a fixed 13-bit depth. For clarity, $P_{LPS}$ refers to $p_{LPS}$ scaled according to the fixed point range, and A refers to the scaled probability adaptation factor a. In such implementations, $R_{LPS}$ equals R times $P_{LPS}$, plus $2^{n-1}$, divided by $2^n$. This division can be efficiently performed by n rightward bit shifts or discarding of n least significant bits, in some implementations. In a further implementation, if the calculated $R_{LPS}$ is less than 2, the result can be increased to 2, to allow for very small ranges R. During the context update, the most probable symbol value can be updated by determining if $P_{LPS}$ is greater than or equal to $2^{n-1}$. Probabilities can be updated during the context update, based on whether binVal is equal to valMps or 1–valMps. If binVal is equal to valMps, then $P_{LPS}$ can be updated to equal A times the prior $P_{LPS}$, plus $2^{n-1}$, divided by $2^n$ (e.g. via an n-bit shift, as discussed above, in some implementations). If binVal is not equal to valMps, then a further determination may be made as to whether $P_{LPS}$ is greater than or equal to $2^{n-1}$, or less than $2^{n-1}$. If $P_{LPS}$ is less than $2^{n-1}$, then $P_{LPS}$ can be updated to equal A times the prior $P_{LPS}$, plus $2^n$ times the difference of $2^n$ minus A, plus $2^{n-1}$, divided by $2^n$. If $P_{LPS}$ is greater than or equal to $2^{n-1}$, then the updated valMps can be set equal 1 minus the previous valMps, inverting the value of the next most probable symbol. Since the value of MPS is inverted, the associated probability for LPS may also be inverted, by updating $P_{LPS}$ to equal $2^n - P_{LPS}$ (referred to as the intermediate $P_{LPS}$ or inverted $P_{LPS}$). This intermediate or inverted $P_{LPS}$ may then be updated a second time to equal A times the intermediate $P_{LPS}$ plus $2^{n-1}$, divided by $2^n$ or bit shifted n places to the right. In some implementations, these steps may be combined in a single step with $P_{LPS}$ equal to A times the difference of $2^n$ minus the prior $P_{LPS}$, plus $2^{n-11}$, divided by $2^n$.

In other implementations of context updating, the order of the probability update and $P_{LPS}$ determination may be reversed, which may allow generation of the intermediate $P_{LPS}$ to be skipped. Specifically, in such implementations, after determining that binVal is not equal to valMps, $P_{LPS}$ may be updated to equal A times the prior $P_{LPS}$, plus $2^n$ times the difference of $2^n$ minus A, plus $2^{n-1}$, divided by $2^n$ as discussed above. Subsequently, the codec may determine whether $P_{LPS}$ is greater than or equal to $2^{n-1}$, or less than $2^{n-1}$. If $P_{LPS}$ is less than $2^{n-1}$, then the context update is complete as the probability does not need to be inverted. If $P_{LPS}$ is greater than or equal to $2^{n-1}$, then the next most probable symbol value valMps may be inverted or set equal to 1 minus valMps. The probability may similarly be inverted, with $P_{LPS}$ updated to equal $2^n$ minus the prior $P_{LPS}$. This order of operations may somewhat simplify the required processing, in some implementations.

Figure 7:
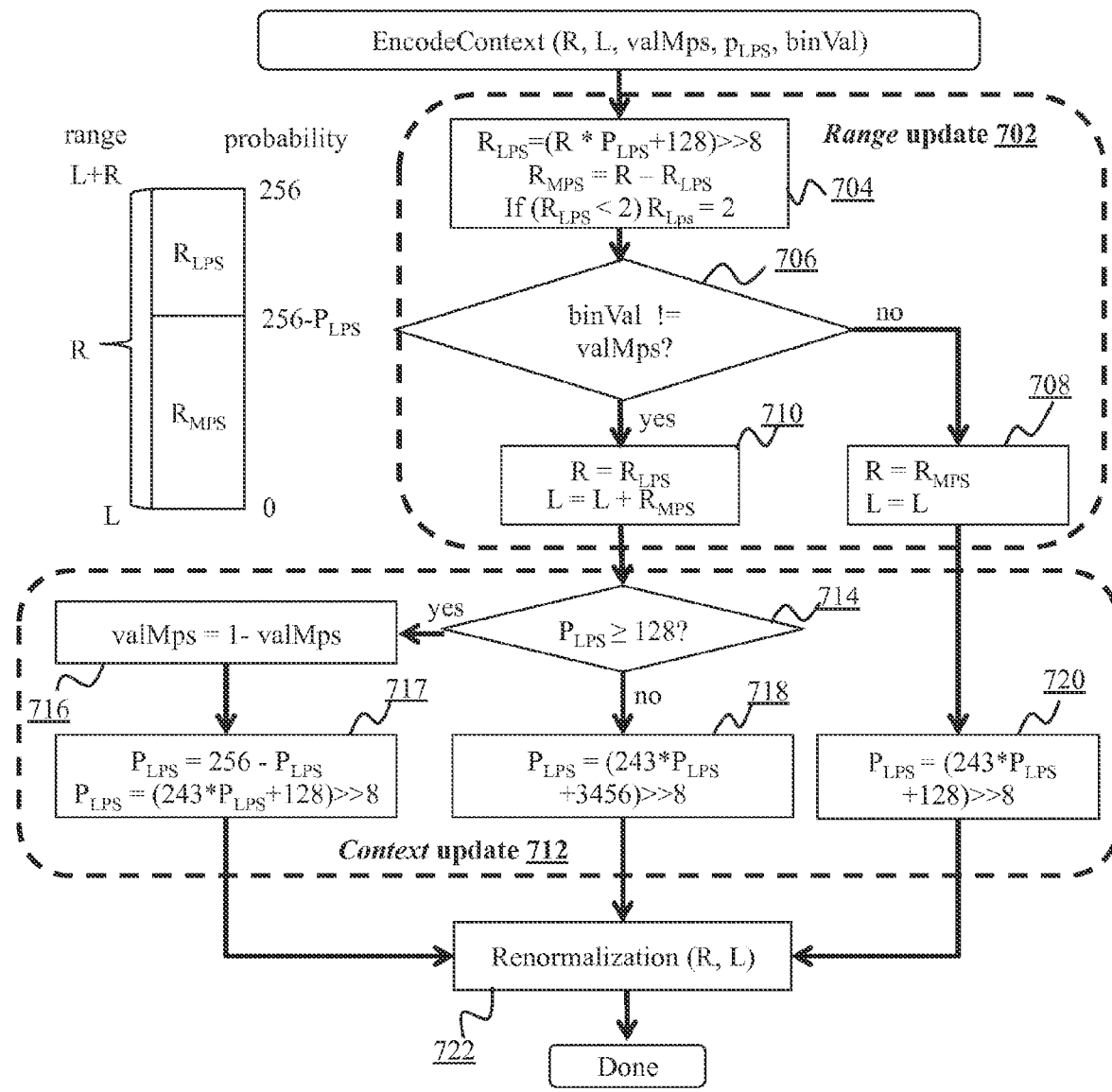
FIG. 7 is a flow chart of a second embodiment of CABAC range and context updating during encoding.

One implementation of this method of CABAC range and context updating during encoding is illustrated in the flow chart of FIG. 7, using an 8-bit fixed point design as discussed above. As with the embodiment of FIG. 5, the range can be defined by values L, R, with L representing the bottom of the range and L+R representing the top of the range. As discussed above, $p_{LPS}$ can define the value of the probability of the least probable symbol, with $P_{LPS}$ equal to the scaled value of $p_{LPS}$. 256 minus $P_{LPS}$ therefore defines the probability of the least probable symbol. Accordingly, at step 704 of range update 702 and in implementations using the 8-bit fixed point design, $R_{LPS}$ can be equal to R times $P_{LPS}$ plus 128, divided by 256 (e.g. with an 8-bit shift, or with the 8 least significant bits discarded). To scale for very small values of R, if the calculated $R_{LPS}$ is less than 2, then $R_{LPS}$ can be fixed or increased to 2 (or any other small values, in various implementations). As with the embodiment of FIG. 5, $R_{MPS}$ can be equal to R minus $R_{LPS}$. At step 706, the encoder can determine if the binVal is equal to the valMps. If the binVal is equal to the valMps, then at step 708, the range can be updated with the updated R equal to $R_{MPS}$ and the updated L equal to L (e.g., reducing the overall range to within the previous $R_{MPS}$). If binVal is not equal to valMps, then at step 710, the range can be updated with the updated R equal to $R_{LPS}$ and the updated L equal to L+$R_{MPS}$ (e.g., reducing the overall range to within the previous $R_{LPS}$).

In one implementation, scaled probability adaptation factor A can be equal to 243 (roughly equal to a probability adaptation factor α of 0.95), although other values can be used in other implementations. Keeping the probability adaptation factor α equal to 0.95, in other implementations using different range sizes, scaled adaptation factor A may be equal to 7782 in a 13-bit range (e.g. out of 8192). In other implementations, different probability adaptation factor α values may be used. Such values can be predetermined, or can be set dynamically by an encoder and can be communicated or signaled in the bit stream to the decoder (e.g. in a header, flag, or other field). Given a value of 243 for A, if the binVal was equal to the valMps, then at step 720 of context update 712, $P_{LPS}$ can be updated to equal 243 times the prior $P_{LPS}$ plus 128, divided by 256 (or with an 8-bit shift, as discussed above). If the binVal was not equal to the valMps, then at step 714, the encoder can determine whether $P_{LPS}$ was greater than or equal to 128. If $P_{LPS}$ was greater than or equal to 128, then at step 716, valMps can be updated to equal to 1 minus the previous valMps. At step 717, an intermediate or inverted $P_{LPS}$ may be calculated equal to 256 minus the prior $P_{LPS}$. $P_{LPS}$ may then be updated to equal 243 times the intermediate $P_{LPS}$, plus 128, divided by 256 (e.g. an 8-bit shift). As discussed above, in some implementations, this may be done in a single step without generating the intermediate $P_{LPS}$ (e.g. $P_{LPS}=(243*(256-P_{LPS})+128)>>8$). If $P_{LPS}$ was less than 128, then at step 718, $P_{LPS}$ can be updated to be equal to 243 times the prior $P_{LPS}$, plus 3456 (e.g. $2^n$ times $2^n$ minus A, plus $2^{n-1}$), divided by 256 (e.g. an 8-bit shift). At step 722, the range can be renormalized to take advantage of any unused bits in the range, as discussed above.

Figure 8:
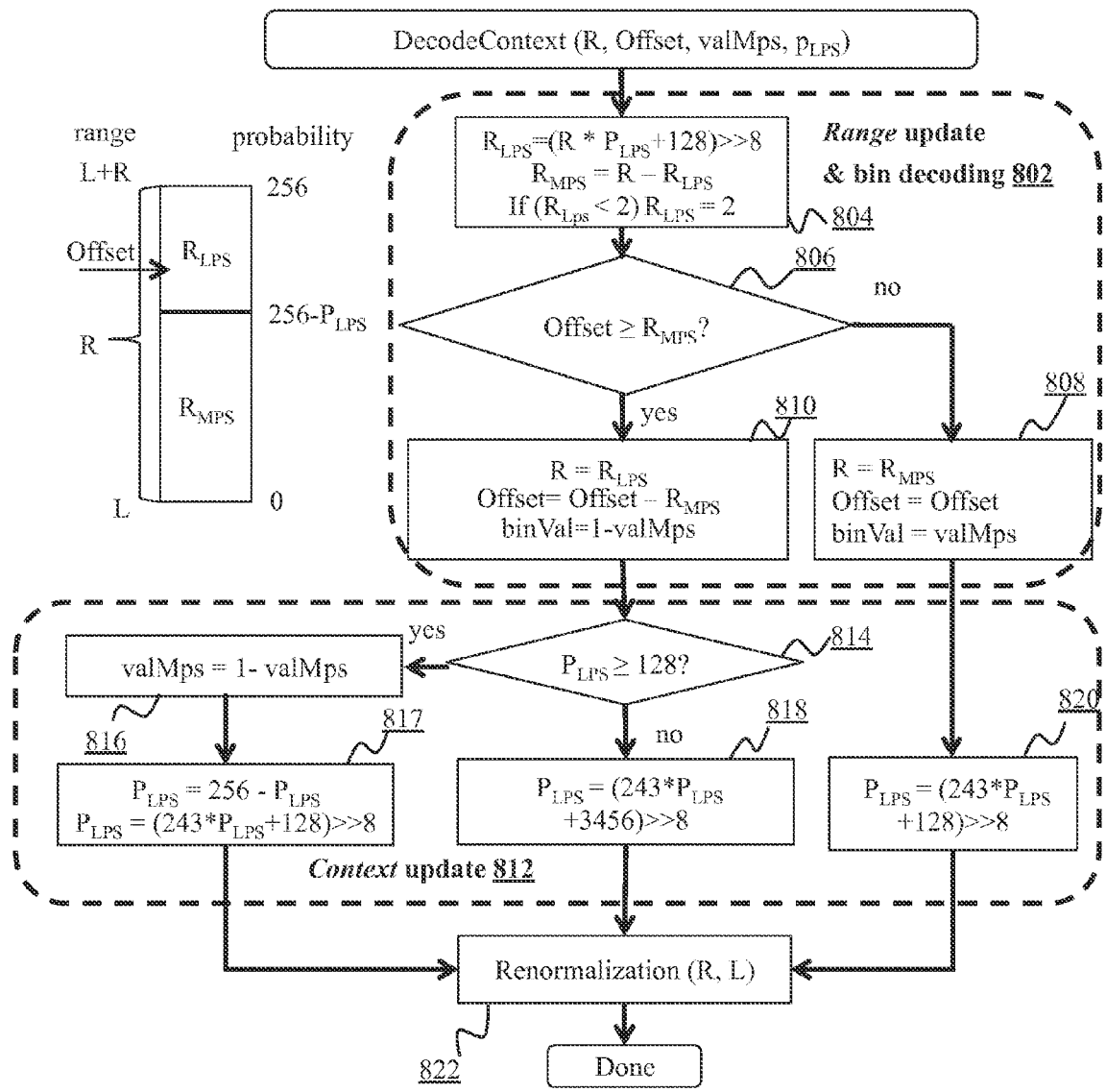
FIG. 8 is a flow chart of a second embodiment of CABAC range and context updating during decoding.

Similarly, FIG. 8 is a flow chart of a second embodiment of CABAC range and context updating during decoding using an 8-bit fixed point design. At step 804 of the bin decoding and range update procedure 802, the decoder can determine $R_{LPS}$ and $R_{MPS}$ from the input range and probability, with $R_{LPS}$ equal to R times $P_{LPS}$, plus 128, divided by 256 (e.g. an 8-bit shift). If the calculated $R_{LPS}$ is less than 2, then $R_{LPS}$ can be increased to equal 2, as discussed above in connection with step 704. $R_{MPS}$ can be set equal to R minus $R_{LPS}$. At step 806, the decoder can determine if the offset is greater than or equal to $R_{MPS}$ (i.e. within the range $R_{LPS}$). If the offset is not greater than or equal to $R_{MPS}$, then at step 808, the range R can be updated to equal $R_{MPS}$, the offset can be updated to equal the offset, and the binVal can be decoded as equal to the valMps, as with step 608 discussed above. If the offset is greater than or equal to $R_{MPS}$, then at step 810, the range R can be updated to equal $R_{LPS}$; the binVal can be output as the inverse of valMps (e.g. 1−valMps); and the offset can be remapped to the new range as equal to the offset minus $R_{MPS}$.

If the offset was not greater than or equal to the $R_{MPS}$, then at step 820, $P_{LPS}$ can be updated to equal 243 times the prior $P_{LPS}$, plus 128, divided by 256 (again, with scaled adaptation factor A equal to 243, as discussed above in connection with FIG. 7). Conversely, if the offset was greater than or equal to the $R_{MPS}$, then at step 814, the decoder can determine whether $P_{LPS}$ was greater than or equal to 128. If $P_{LPS}$ was greater than or equal to 128, then at step 816, the context can be updated with the updated valMps equal to 1 minus the previous valMps. At step 817, an intermediate or inverted $P_{LPS}$ may be calculated equal to 256 minus the prior $P_{LPS}$. $P_{LPS}$ may then be updated to equal 243 times the intermediate $P_{LPS}$, plus 128, divided by 256 (e.g. an 8-bit shift). As discussed above, in some implementations, this may be done in a single step without generating the intermediate $P_{LPS}$ (e.g. $P_{LPS}=(243*(256−P_{LPS})+128)>>8)$. At step 818, $P_{LPS}$ can be updated to be equal to 243 times the prior $P_{LPS}$, plus 3456, divided by 256 (e.g. with an 8-bit shift, as shown). At step 822, the range can be renormalized to take advantage of any unused bits in the range, with a new R and offset output as needed, as discussed above at step 522.

Figure 9:
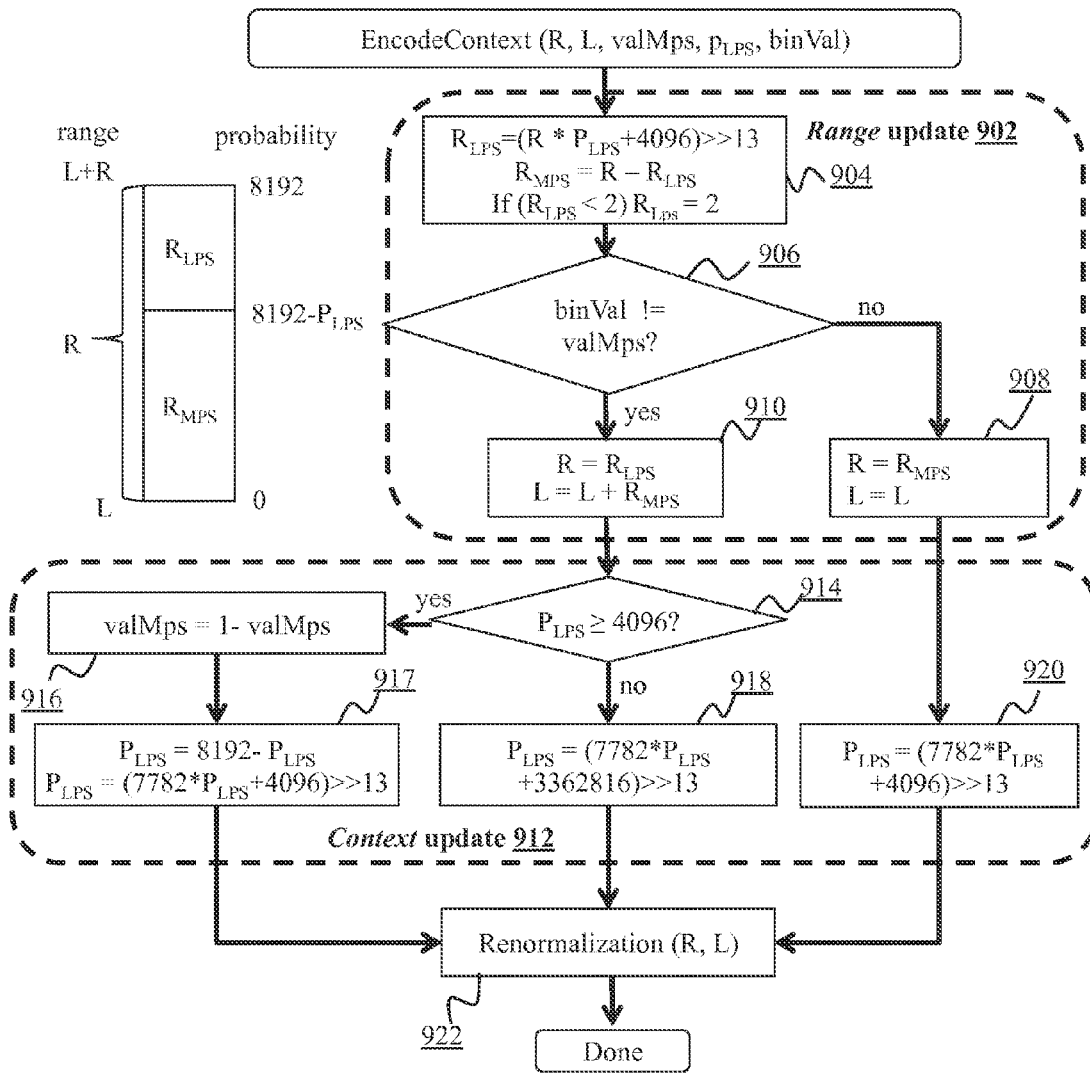
FIG. 9 is a flow chart of a third embodiment of CABAC range and context updating during encoding.
Figure 10:
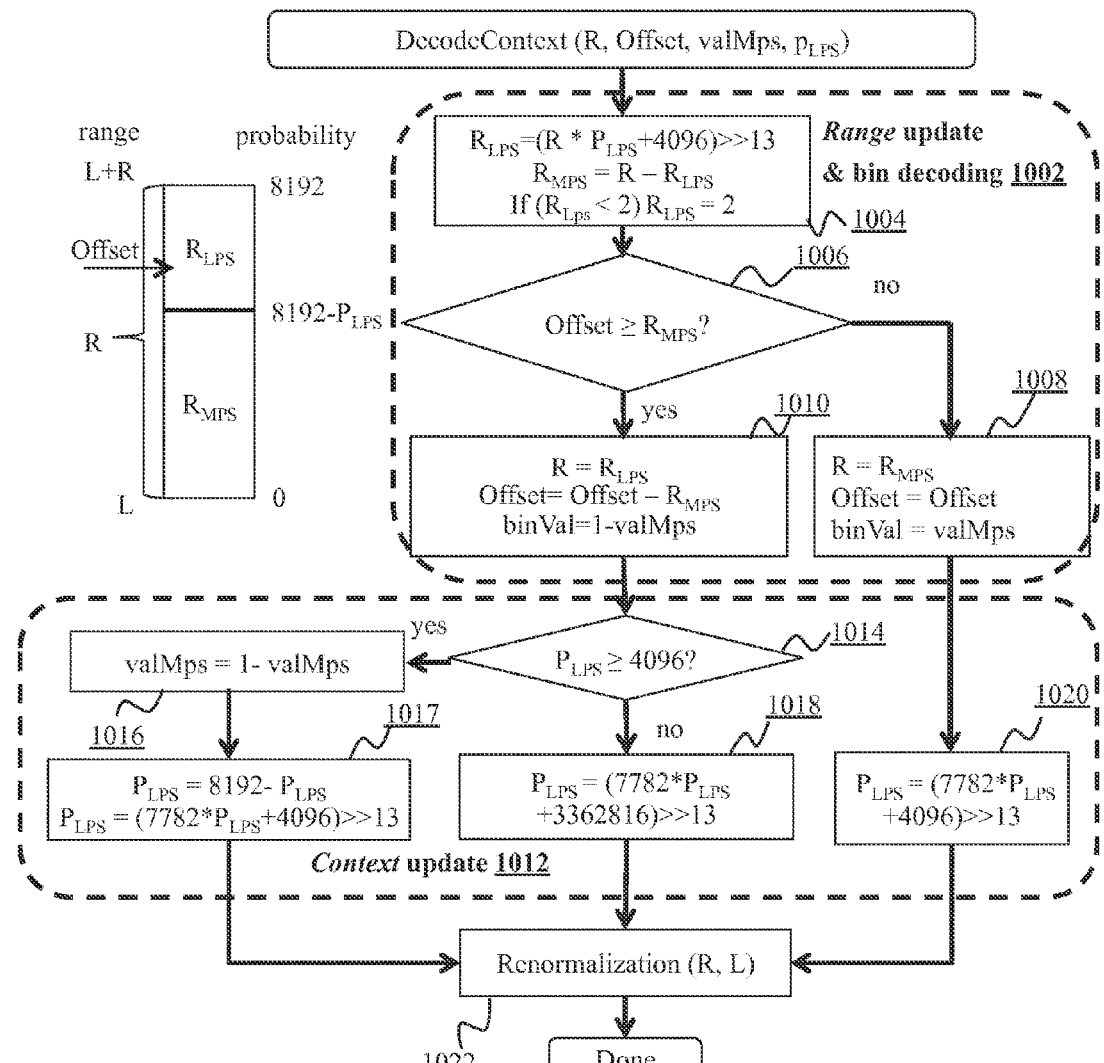
FIG. 10 is a flow chart of a third embodiment of CABAC range and context updating during decoding.

FIGS. 9 and 10 are flow charts of an embodiment of range and context updating for a CABAC encoder and decoder, respectively, using a 13-bit fixed point design in place of the 8-bit design of FIGS. 7 and 8. As shown, in implementations using a 13-bit fixed point design, the probability ranges from 0 to 8192 instead of 0 to 256 as in the 8-bit design. Although steps 904-922 are similar to steps 704-722, and steps 1004-1022 are similar to steps 804-1022, the calculation variables are increased to correspond to the 13-bit design. For example, at steps 904 and 1004, $R_{LPS}$ can be equal to R times $P_{LPS}$ plus 4096, divided by 8192 (e.g. with a 13-bit shift, or with the 13 least significant bits discarded). Similarly, at steps 914 and 1014, $P_{LPS}$ may be compared to 4096. In some implementations using a 13-bit fixed point depth, A may be set equal to 7782. Accordingly, at steps 920 and 1020, $P_{LPS}$ may be updated as 7782 times the prior $P_{LPS}$, plus 4096, divided by 8192. At steps 917 and 1017, an intermediate $P_{LPS}$ may be calculated as the difference of 8192 minus $P_{LPS}$, and $P_{LPS}$ may be updated to equal 7782 times the intermediate $P_{LPS}$, plus 4096, divided by 8192 (or with such calculations made in a single step, as discussed above). At steps 918 and 1018, $P_{LPS}$ may be updated to equal 7782 times the prior $P_{LPS}$ plus 3,362,816 (i.e. $2^{13}*(2^{13}−7782)+2^{12}$), divided by 8192.

Figure 11:
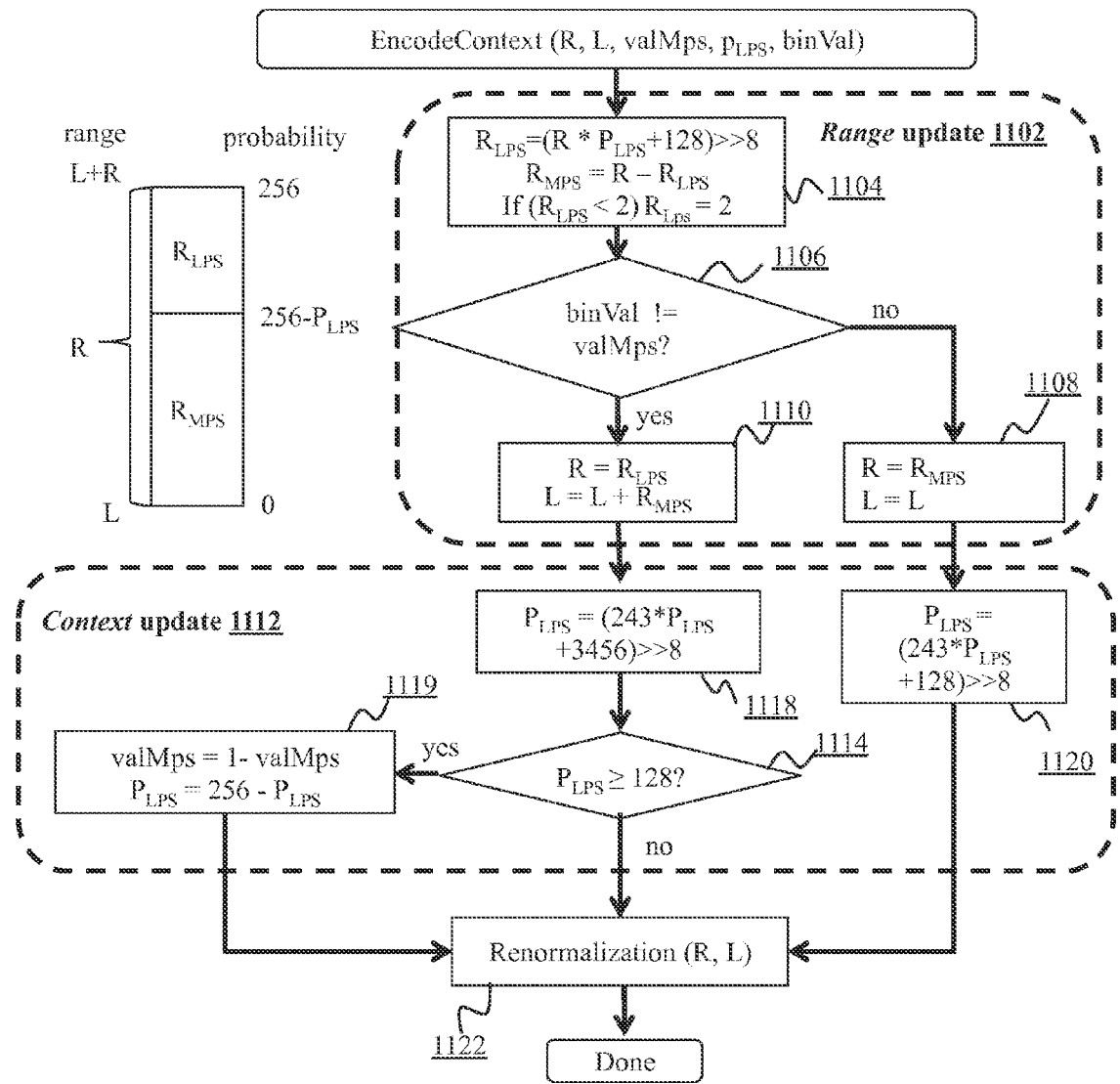
FIG. 11 is a flow chart of a fourth embodiment of CABAC range and context updating during encoding.

In some implementations, context updating in the encoder and decoder may be simplified by reversing the order of steps 714 (or 814, 914, or 1014) and 718 (or 818, 918, or 1018). FIG. 11 illustrates one such implementation for an 8-bit fixed point design. As shown, FIG. 11 is similar to FIG. 7 above, with identical steps 1104-1114, and 1120-1122. However, step 1118 has been moved prior to step 1114. The update to $P_{LPS}$ of step 1118 may be applied to instances in which the prior $P_{LPS}$ is greater than or less than $2^{n-1}$ (e.g. 128) by combining steps 716 and 717 into new step 1119. Specifically, after performing step 1118, step 1114 is performed and the coder determines whether $P_{LPS}$ is greater than or equal to 128. If not, then the process may proceed to step 1122, as $P_{LPS}$ has already been updated. If $P_{LPS}$ is greater than or equal to 128, then at step 1119, valMps may be inverted or updated to equal 1−valMps (as in step 716), and the $P_{LPS}$ generated at step 1118 may be similarly inverted or updated to equal 256−$P_{LPS}$. Accordingly, both the value of the next most probable symbol and the probability of the next most probability symbol may be inverted at this step. The process may then proceed to step 1122.

Figure 12:
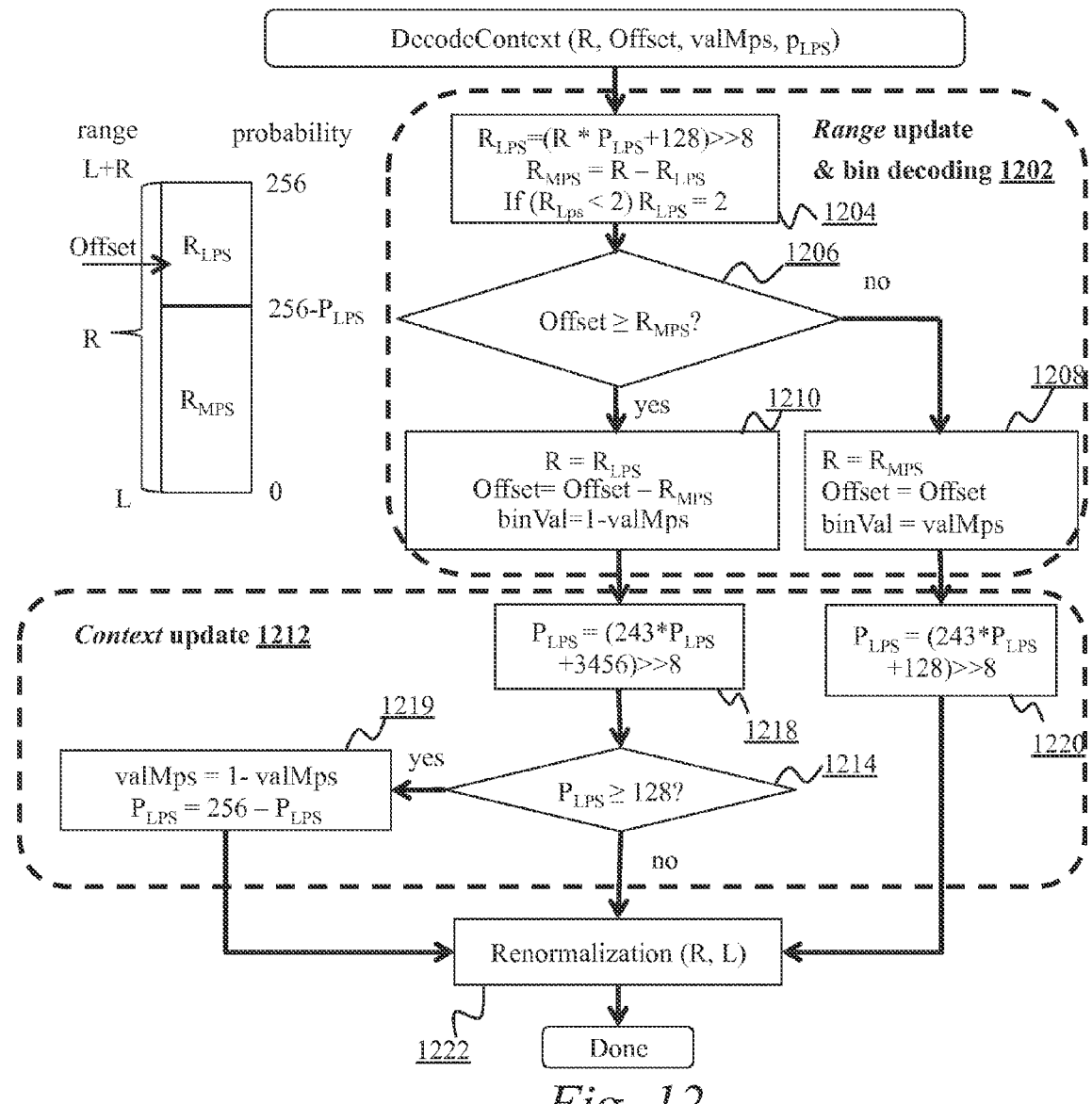
FIG. 12 is a flow chart of a fourth embodiment of CABAC range and context updating during decoding.

FIG. 12 is likewise similar to FIG. 8 above, with identical steps 1204-1214, and 1220-1222. Step 1218 has been moved prior to step 1214, as in FIG. 11. After performing step 1218, step 1214 is performed and the coder determines whether $P_{LPS}$ is greater than or equal to 128. If not, then the process may proceed to step 1222, as $P_{LPS}$ has already been updated. If $P_{LPS}$ is greater than or equal to 128, then at step 1219, valMps may be inverted or updated to equal 1−valMps (as in step 816), and the $P_{LPS}$ generated at step 1218 may be similarly inverted or updated to equal 256−$P_{LPS}$. The process may then proceed to step 1222.

Figure 13:
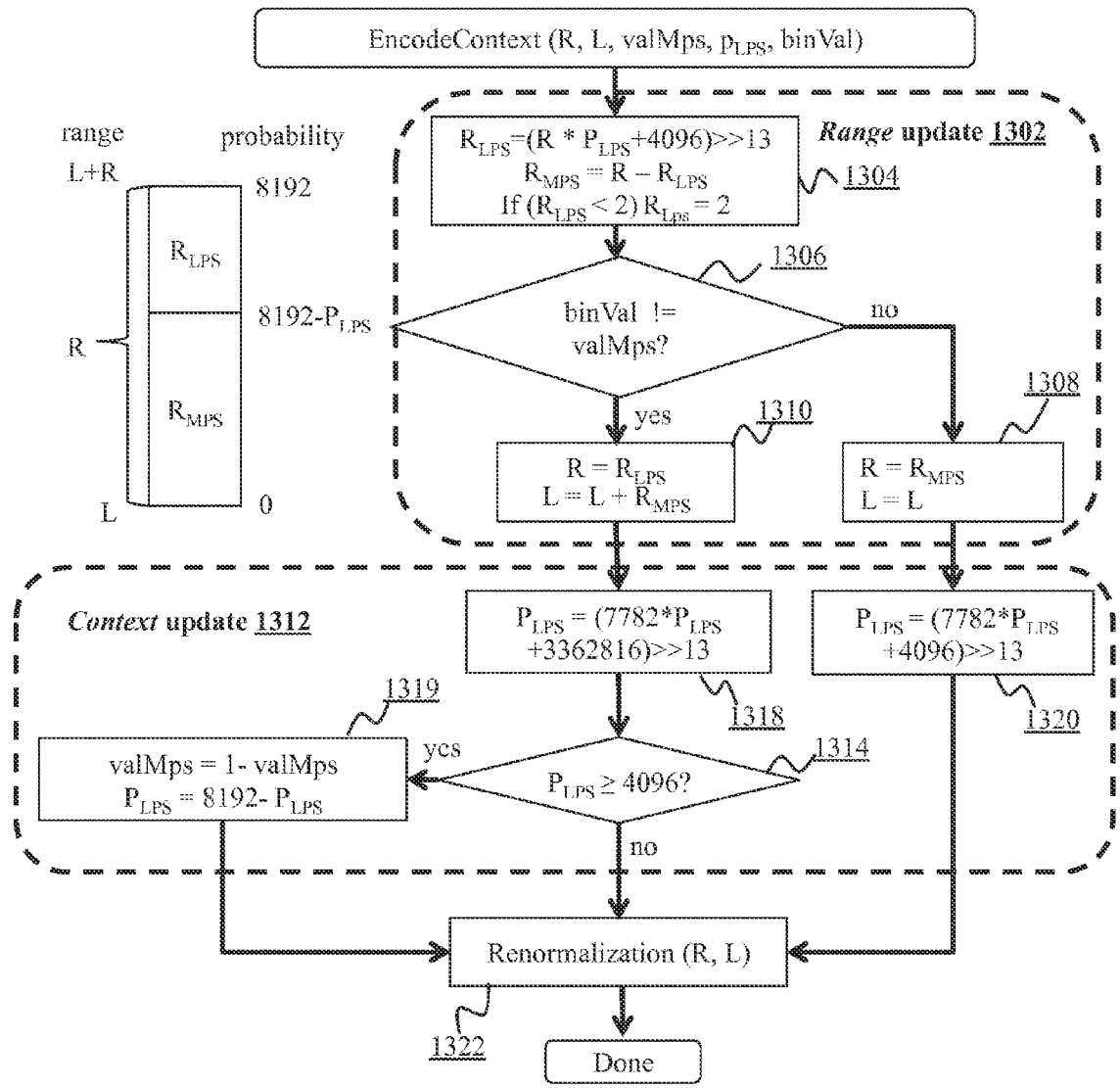
FIG. 13 is a flow chart of a fifth embodiment of CABAC range and context updating during encoding.
Figure 14:
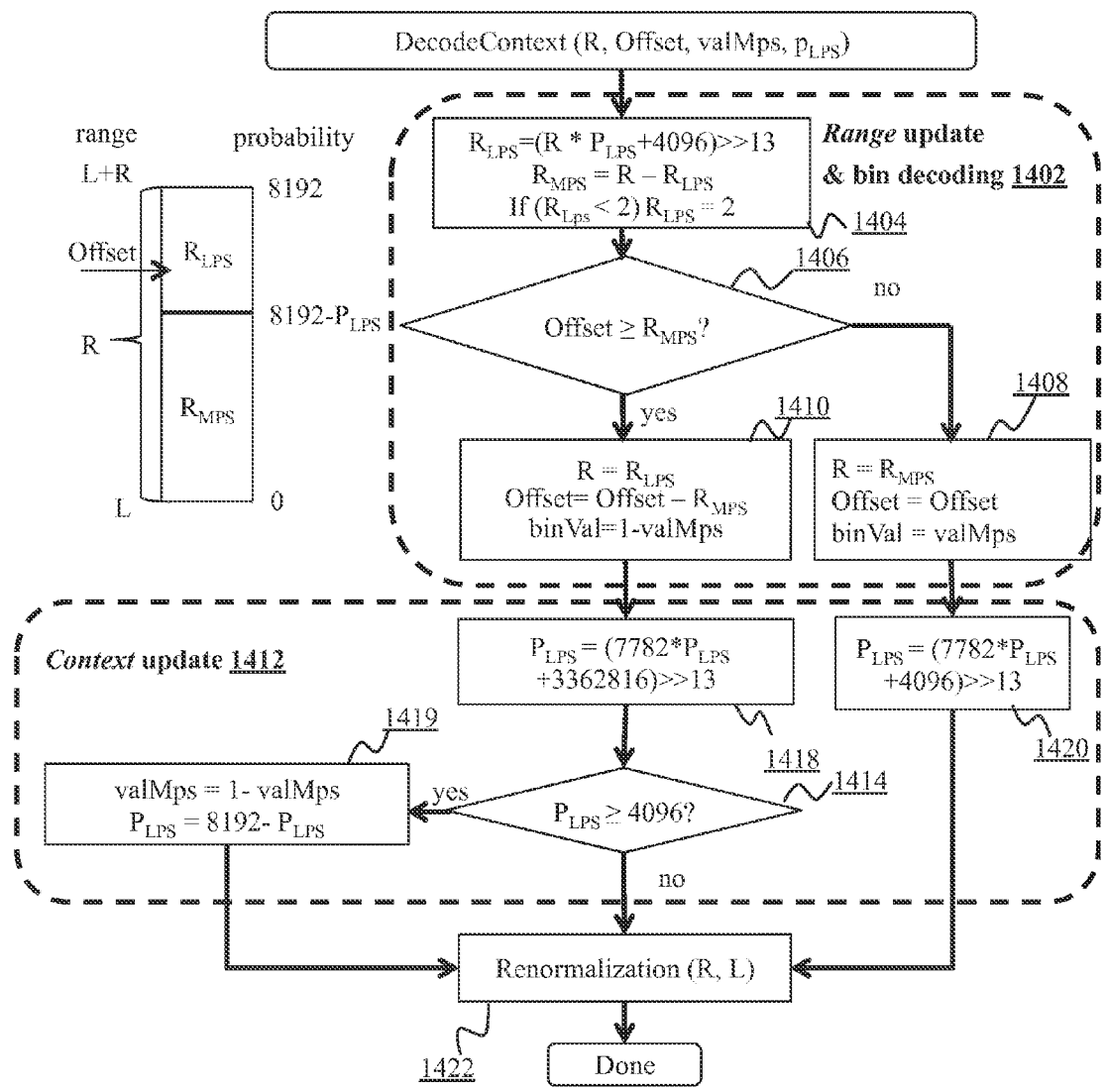
FIG. 14 is a flow chart of a fifth embodiment of CABAC range and context updating during decoding.

FIGS. 13 and 14 illustrate a 13-bit fixed point implementation of the method of FIGS. 11 and 12, respectively. As shown, the order of steps 1314 and 1318 are reversed from the method of FIGS. 9 and 10, and new steps 1319 and 1419 provide inversion of the value of the next most probable symbol and the probability of the next most probability symbol.

Accordingly, via the use of a fixed point design for range and context updates in CABAC encoding and decoding, table look-ups can be avoided and additional efficiency created through reduced encoder and decoder complexity.

B. System Environment

Figure 15A:
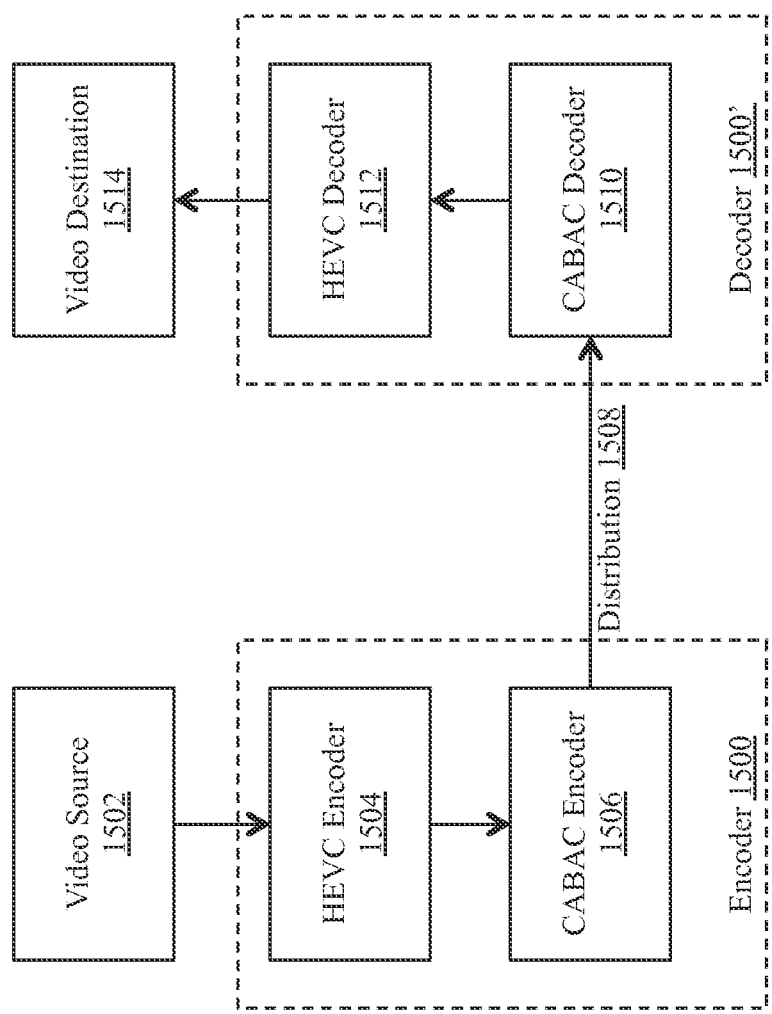
FIG. 15A is a block diagram depicting an embodiment of a system environment.

Having discussed specific embodiments of the present solution, it may be helpful to describe aspects of the operating environment as well as associated system components (e.g., hardware elements) in connection with the methods and systems described herein. Referring to FIG. 15A, a block diagram of a system is depicted. In brief overview, the system includes a video source 1502, an HEVC encoder 1504, a CABAC encoder 1506, a distribution or transmission system 1508, a CABAC decoder 1510, an HEVC decoder 1512, and a video destination 1514. In many implementations, HEVC encoder 1504 and CABAC encoder 1506 can together be referred to as an encoder 1500, and can be integrated in a single device or as a single video encoder. Similarly, CABAC decoder 1510 and HEVC decoder 1512 can together be referred to as a decoder 1500', and can be integrated in a single device or as a single video decoder. The details of embodiments of each such device are described in greater detail with reference to FIGS. 15B and 15C.

Still referring to FIG. 15A, and in more detail, a video source 1502 can include any type and form of video source, such as a broadcast source, recorded source, rendering device, switcher, computing device, portable device, or any other such device outputting a stream of images for encoding and transmission. Similarly, a video destination 1514 can include any type and form of video destination, such as a broadcast destination, recording device, switcher, computing device, portable device, or any other such device receiving a stream of images for display, storage, processing, or other functions. Although shown separate, in many embodiments a video source 1502 can include an HEVC encoder 1504 and/or a CABAC encoder 1506; and a video destination 1514 can include an HEVC decoder 1512 and/or a CABAC decoder 1510.

HEVC encoder 1504 and HEVC decoder 1512 can include hardware, software, or any combination of hardware and software for encoding and decoding, respectively, video in compliance with one or more lossy or lossless encoding standards. Although referred to as HEVC encoders and decoders, in other implementations, other formats can be used interchangeably, such as H.264 encoders and decoders, AVC encoders and decoders, VP9 encoders and decoders, AVS+ encoders and decoders, AVS2 encoders and decoders, etc.

CABAC encoder 1506 and CABAC decoder 1510 can include hardware, software, or any combination of hardware and software for performing fixed point CABAC encoding and decoding, such as the implementations discussed above in connection with FIGS. 7 and 8, FIGS. 9 and 10, FIGS. 11 and 12 or FIGS. 13 and 14. In many implementations, CABAC encoding and decoding can each be part of the same devices performing HEVC encoding and decoding, respectively, such as encoder 1500 and decoder 1500'. Device 1500, 1500' can be a computing device, such as a desktop, laptop, portable, wearable, or tablet computer; a smart phone; a video game console; a set top box; a smart television; or any other type and form of device. In some implementations, a device 1500, 1500' can be a virtual device or virtual machine executed by one or more physical machines. For example, in one implementation, encoding and/or decoding can be performed by a server farm or cloud of virtual machines.

Distribution channel 1508 can include any type and form of distribution channel for delivering CABAC-encoded data to decoder 1500', such as a digital broadcast channel, a satellite broadcast channel, a cellular network, a wired network, a wireless network, a wide area network such as the Internet, a local area network, a physical exchange of data storage (e.g. physical transfer of a DVD, BluRay disc, flash memory drive, or other storage device, sometimes referred to as a Sneaker-Net), or any other type and form or combination of distribution channels.

Figure 15B:
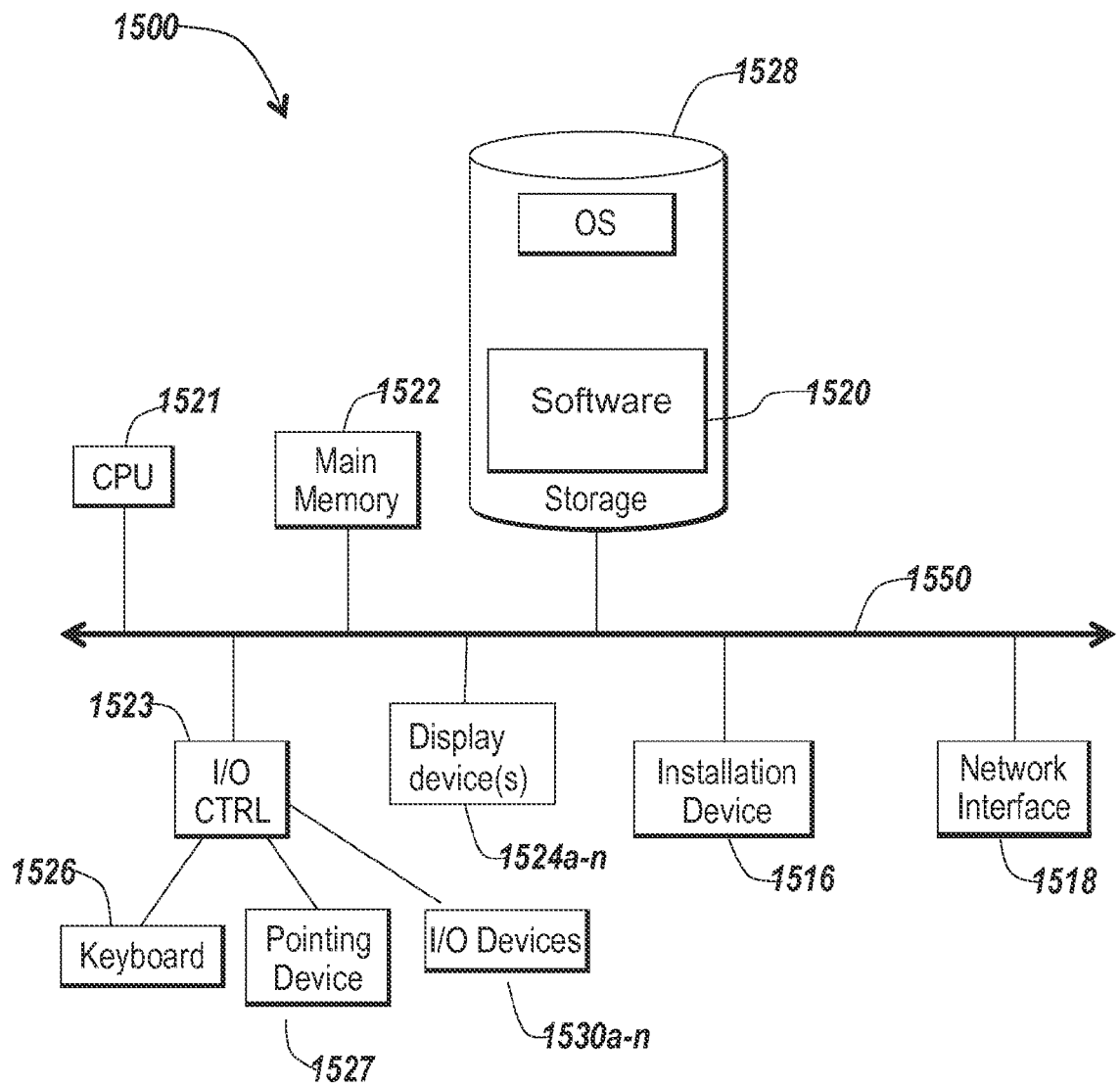
FIGS. 15B and 15C are block diagrams depicting embodiments of devices useful in connection with the methods and systems described herein.
Figure 15C:
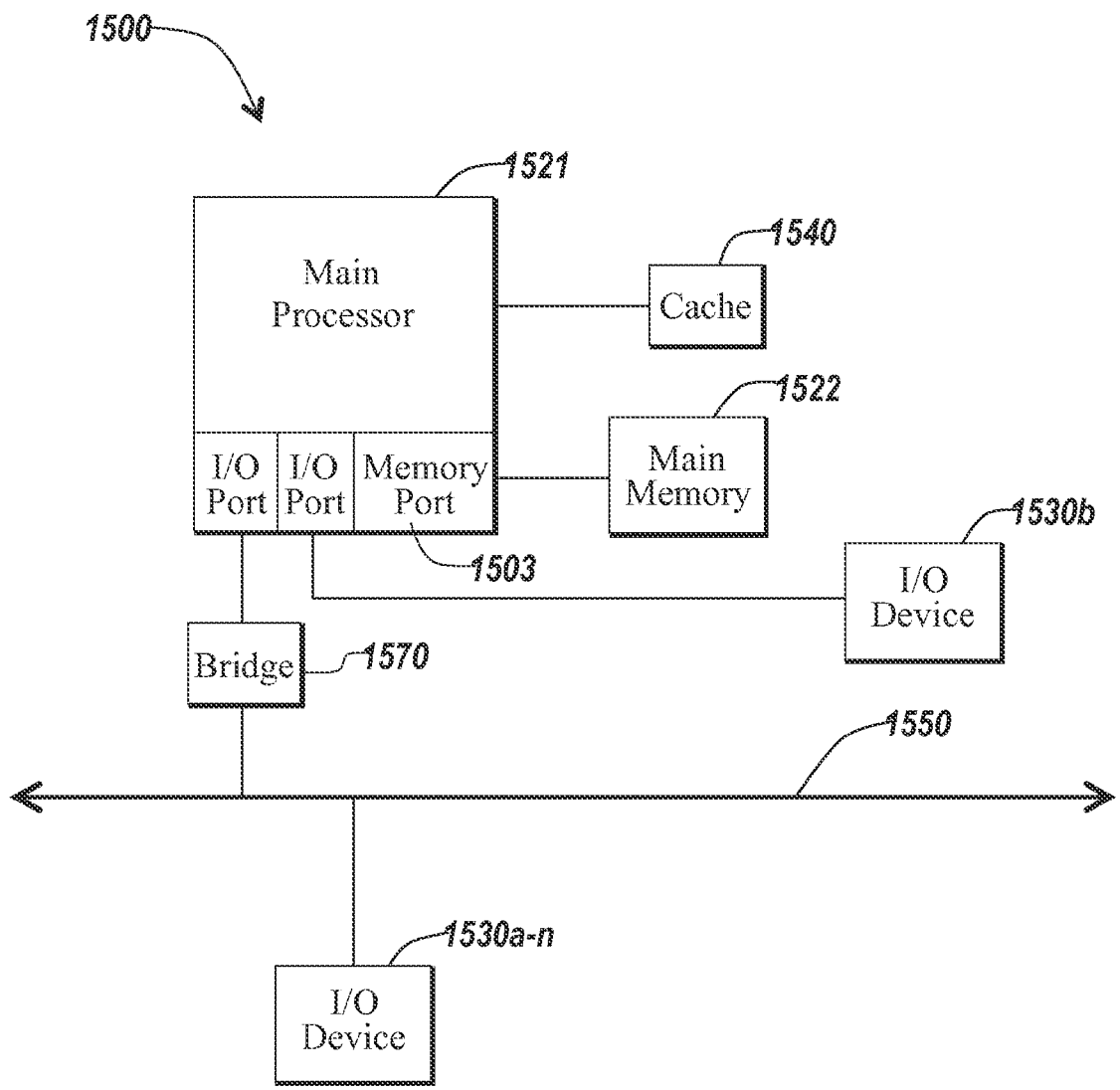

Encoder 1500, decoder 1500', or any of devices 1502-1506 and 1510-1514 can be deployed as and/or executed on any type and form of device, such as a computer, network device or appliance capable of communicating on any type and form of network and performing the operations described herein. FIGS. 15B and 15C depict block diagrams of an embodiment of one such device 1500. As shown in FIGS. 15B and 15C, each device 1500 includes a central processing unit 1521, and a main memory unit 1522. As shown in FIG. 15B, a device 1500 can include a storage device 1528, an installation device 1516, a network interface 1518, an I/O controller 1523, display devices 1524a-1524n, a keyboard 1526 and a pointing device 1527, such as a mouse. The storage device 1528 can include, without limitation, an operating system and/or software. As shown in FIG. 15C, each device 1500 can also include additional optional elements, such as a memory port 1503, a bridge 1570, one or more input/output devices 1530a-1530n (generally referred to using reference numeral 1530), and a cache memory 1540 in communication with the central processing unit 1521.

The central processing unit 1521 is any logic circuitry that responds to and processes instructions fetched from the main memory unit 1522. In many embodiments, the central processing unit 1521 is provided by a microprocessor unit, such as: those manufactured by Intel Corporation of Mountain View, Calif.; those manufactured by International Business Machines of White Plains, N.Y.; or those manufactured by Advanced Micro Devices of Sunnyvale, Calif. The device 1500 can be based on any of these processors, or any other processor capable of operating as described herein.

Main memory unit 1522 can be one or more memory chips capable of storing data and allowing any storage location to be directly accessed by the microprocessor 1521, such as any type or variant of Static random access memory (SRAM), Dynamic random access memory (DRAM), Ferroelectric RAM (FRAM), NAND Flash, NOR Flash and Solid State Drives (SSD). The main memory 1522 can be based on any of the above described memory chips, or any other available memory chips capable of operating as described herein. In the embodiment shown in FIG. 15B, the processor 1521 communicates with main memory 1522 via a system bus 1550 (described in more detail below). FIG. 15C depicts an embodiment of a device 1500 in which the processor communicates directly with main memory 1522 via a memory port 1503. For example, in FIG. 15C the main memory 1522 can be DRDRAM.

FIG. 15C depicts an embodiment in which the main processor 1521 communicates directly with cache memory 1540 via a secondary bus, sometimes referred to as a backside bus. In other embodiments, the main processor 1521 communicates with cache memory 1540 using the system bus 1550. Cache memory 1540 typically has a faster response time than main memory 1522 and is provided by, for example, SRAM, BSRAM, or EDRAM. In the embodiment shown in FIG. 15C, the processor 1521 communicates with various I/O devices 1530 via a local system bus 1550. Various buses can be used to connect the central processing unit 1521 to any of the I/O devices 1530, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 1524, the processor 1521 can use an Advanced Graphics Port (AGP) to communicate with the display 1524. FIG. 15C depicts an embodiment of a device 1500 in which the main processor 1521 can communicate directly with I/O device 1530b, for example via HYPERTRANSPORT, RAPIDIO, or INFINI-BAND communications technology. FIG. 15C also depicts an embodiment in which local busses and direct communication are mixed: the processor 1521 communicates with I/O device 1530a using a local interconnect bus while communicating with I/O device 1530b directly.

A wide variety of I/O devices 1530a-1530n can be present in the device 1500. Input devices include keyboards, mice, trackpads, trackballs, microphones, dials, touch pads, touch screen, and drawing tablets. Output devices include video displays, speakers, inkjet printers, laser printers, projectors and dye-sublimation printers. The I/O devices can be controlled by an I/O controller 1523 as shown in FIG. 15B. The I/O controller can control one or more I/O devices such as a keyboard 1526 and a pointing device 1527, e.g., a mouse or optical pen. Furthermore, an I/O device can also provide storage and/or an installation medium 1516 for the device 1500. In still other embodiments, the device 1500 can provide USB connections (not shown) to receive handheld USB storage devices such as the USB Flash Drive line of devices manufactured by Twintech Industry, Inc. of Los Alamitos, Calif.

Referring again to FIG. 15B, the device 1500 can support any suitable installation device 1516, such as a disk drive, a CD-ROM drive, a CD-R/RW drive, a DVD-ROM drive, a flash memory drive, tape drives of various formats, USB device, hard-drive, a network interface, or any other device suitable for installing software and programs. The device 1500 can further include a storage device, such as one or more hard disk drives or redundant arrays of independent disks, for storing an operating system and other related software, and for storing application software programs such as any program or software 1520 for implementing the systems and methods described herein. Optionally, any of the installation devices 1516 could also be used as the storage device. Additionally, the operating system and the software can be run from a bootable medium.

Furthermore, the device 1500 can include a network interface 1518, including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the device 1500 communicates with other devices 1500' via any type and/or form of gateway or tunneling protocol such as Secure Socket Layer (SSL) or Transport Layer Security (TLS). The network interface 1518 can include a built-in network adapter, network interface card, PCMCIA network card, card bus network adapter, wireless network adapter, USB network adapter, modem or any other device suitable for interfacing the device 1500 to any type of network capable of communication and performing the operations described herein.

In some embodiments, the device 1500 can include or be connected to one or more display devices 1524a-1524n. As such, any of the I/O devices 1530a-1530n and/or the I/O controller 1523 can include any type and/or form of suitable hardware, software, or combination of hardware and software to support, enable or provide for the connection and use of the display device(s) 1524a-1524n by the device 1500. For example, the device 1500 can include any type and/or form of video adapter, video card, driver, and/or library to interface, communicate, connect or otherwise use the display device(s) 1524a-1524n. In one embodiment, a video adapter can include multiple connectors to interface to the display device(s) 1524a-1524n. In other embodiments, the device 1500 can include multiple video adapters, with each video adapter connected to the display device(s) 1524a-1524n. In some embodiments, any portion of the operating system of the device 1500 can allow multiple displays 1524a-1524n. One ordinarily skilled in the art will recognize and appreciate the various ways and embodiments that a device 1500 can have one or more display devices 1524a-1524n.

In further embodiments, an I/O device 1530 can be a bridge between the system bus 1550 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or a HDMI bus.

A device 1500 of the sort depicted in FIGS. 15B and 15C can operate under the control of an operating system, which control scheduling of tasks and access to system resources. The device 1500 can be running any operating system such as any of the versions of the MICROSOFT WINDOWS operating systems, the different releases of the Unix and Linux operating systems, any version of the MAC OS for Macintosh computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Wash.; MAC OS, produced by Apple Computer of Cupertino, Calif.; WebOS, produced by Research In Motion (RIM); OS/2, produced by International Business Machines of Armonk, N.Y.; and Linux, a freely-available operating system distributed by Caldera Corp. of Salt Lake City, Utah, or any type and/or form of a Unix operating system, among others.

The device 1500 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication, and has sufficient processor power and memory capacity to perform the operations described herein.

In some embodiments, the device 1500 can have different processors, operating systems, and input devices consistent with the device. For example, in one embodiment, the device 1500 is a smart phone, mobile device, tablet or personal digital assistant. In still other embodiments, the device 1500 is an Android-based mobile device, an iPhone smart phone manufactured by Apple Computer of Cupertino, Calif., or a Blackberry or WebOS-based handheld device or smart phone, such as the devices manufactured by Research In Motion Limited. Moreover, the device 1500 can be any workstation, desktop computer, laptop or notebook computer, server, handheld computer, mobile telephone, any other computer, or other form of computing or telecommunications device that is capable of communication and that has sufficient processor power and memory capacity to perform the operations described herein.

Although the disclosure may reference one or more "users", such "users" can refer to user-associated devices or stations (STAs), for example, consistent with the terms "user" and "multi-user" typically used in the context of a multi-user multiple-input and multiple-output (MU-MIMO) environment.

It should be noted that certain passages of this disclosure may reference terms such as "first" and "second" in connection with devices, mode of operation, transmit chains, antennas, etc., for purposes of identifying or differentiating one from another or from others. These terms are not intended to merely relate entities (e.g., a first device and a second device) temporally or according to a sequence, although in some cases, these entities can include such a relationship. Nor do these terms limit the number of possible entities (e.g., devices) that can operate within a system or environment.

It should be understood that the systems described above may provide multiple ones of any or each of those components and these components can be provided on either a standalone machine or, in some embodiments, on multiple machines in a distributed system. In addition, the systems and methods described above can be provided as one or more computer-readable programs or executable instructions embodied on or in one or more articles of manufacture. The article of manufacture can be a floppy disk, a hard disk, a CD-ROM, a flash memory card, a PROM, a RAM, a ROM, or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use what is considered presently to be the best mode thereof, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

I claim:

1. A method for simplified range and context updates for context adaptive binary arithmetic coding, comprising:
   receiving, by a parameter updater of a device from a context adaptive binary arithmetic coding (CABAC) encoder or decoder of the device, an encode or decode context comprising a probability of a first least probable symbol;
   scaling, by the parameter updater, the probability of the first least probable symbol within a predetermined range;
   determining, by the parameter updater, a probability of a subsequent second least probable symbol using the scaled probability of the first least probable symbol multiplied by a probability adaptation factor having a value within the predetermined range; and
   providing, by the parameter updater to the CABAC encoder or decoder, the determined probability of the subsequent second least probable symbol.

2. The method of claim 1, wherein the predetermined range comprises an n-bit range, with n greater than 1.

3. The method of claim 2, wherein determining the probability of the subsequent second least probable symbol further uses the scaled probability of the first least probable symbol multiplied by the probability adaptation factor, plus $2^{n-1}$, divided by $2^n$.

4. The method of claim 2, wherein determining the probability of the subsequent second least probable symbol further uses the scaled probability of the first least probable symbol multiplied by the probability adaptation factor, plus $2^n$ multiplied by the difference of $2^n$ and the probability adaptation factor, plus $2^{n-1}$, divided by $2^n$.

5. The method of claim 2, wherein the encode or decode range parameter further comprises a first range; and further comprising determining a second range using the first range multiplied by the scaled probability of the first least probable symbol, plus $2^{n-1}$, divided by $2^n$.

6. The method of claim 5, further comprising providing the second range to the CABAC encoder or decoder.

7. The method of claim 1, further comprising:
   receiving, by the parameter updater, an identification of a most probable symbol;
   determining, by the parameter updater, that the probability of the first least probable symbol is equal to at least half of the predetermined range; and
   inverting the identification of the most probable symbol.

8. The method of claim 1, further comprising:
   receiving an identification of a most probable symbol and a current symbol value;
   determining whether the most probable symbol is equal to the current symbol value; and
   responsive to the determination, adjusting the predetermined range for a subsequent encode or decode range parameter using the scaled probability of the first least probable symbol.

9. The method of claim 8, further comprising adjusting the predetermined range for the subsequent encode or decode range parameter by adjusting the range to a value inversely proportional to the probability of the least probable symbol, responsive to a determination that the current symbol value is equal to the identified most probable symbol.

10. The method of claim 8, further comprising adjusting the predetermined range for the subsequent encode or decode range parameter by reducing the range to a value proportional to the probability of the least probable symbol, responsive to a determination that the current symbol value is not equal to the identified most probable symbol.

11. A device, comprising:
   a context adaptive binary arithmetic coding (CABAC) context receiver in communication with a CABAC encoder or decoder, configured to receive an encode or decode context comprising a probability of a first least probable symbol;
   a CABAC range updater configured to scale the probability of the first least probable symbol within a predetermined range;
   a CABAC context updater configured to determine a probability of a subsequent second least probable symbol using the scaled probability of the first least probable symbol multiplied by a probability adaptation factor having a value within the predetermined range, and provide the determined probability of the subsequent second least probable symbol to a CABAC context selector of the CABAC encoder or decoder.

12. The device of claim 11, wherein the predetermined range comprises an n-bit range, with n greater than 1.

13. The device of claim 12, wherein the CABAC context updater is further configured to determine the probability of the subsequent second least probable symbol using the scaled probability of the first least probable symbol multiplied by the probability adaptation factor, plus $2^{n-1}$, divided by $2^n$.

14. The device of claim 12, wherein the CABAC context updater is further configured to determine the probability of the subsequent second least probable symbol using the scaled probability of the first least probable symbol multiplied by the probability adaptation factor, plus $2^n$ multiplied by the difference of $2^n$ and the probability adaptation factor, plus $2^{n-1}$, divided by $2^n$.

15. The device of claim 12, wherein the encode or decode range parameter further comprises a first range; and wherein the CABAC range updater is further configured to determine a second range using the first range multiplied by the scaled probability of the first least probable symbol, plus $2^{n-1}$, divided by $2^n$, and provide the second range to the CABAC encoder or decoder.

16. The device of claim 11, wherein the CABAC context receiver is further configured to receive an identification of a most probable symbol; and
   wherein the CABAC context updater is further configured to determine that the probability of the first least probable symbol is equal to at least half of the predetermined range, and invert the identification of the most probable symbol.

17. The device of claim 11, wherein the CABAC context receiver is further configured to receive an identification of a most probable symbol and a current symbol value; and
   wherein the CABAC context updater is further configured to determine whether the most probable symbol is equal to the current symbol value, and responsive to the determination, adjust the predetermined range for a subsequent encode or decode range parameter using the scaled probability of the first least probable symbol.

18. The device of claim 17, wherein the CABAC context updater is further configured to adjust the predetermined range for the subsequent encode or decode range parameter by adjusting the range to a value inversely proportional to the probability of the least probable symbol, responsive to a determination that the current symbol value is equal to the identified most probable symbol.

19. The device of claim 17, wherein the CABAC context updater is further configured to adjust the predetermined range for the subsequent encode or decode range parameter by reducing the range to a value proportional to the probability of the least probable symbol, responsive to a determination that the current symbol value is not equal to the identified most probable symbol.

20. A device for updating arithmetic coding parameters, comprising:

a context adaptive binary arithmetic coding (CABAC) range updater configured to receive a probability of a first least probable symbol and scale the probability of the first least probable symbol within a predetermined range; and a CABAC context updater configured to determine a probability of a subsequent second least probable symbol using the scaled probability of the first least probable symbol multiplied by a probability adaptation factor having a value within the predetermined range, and provide the determined probability of the subsequent second least probable symbol to a CABAC context selector of a CABAC encoder or decoder.

* * * * *